(12) United States Patent
Chung et al.

(10) Patent No.: US 10,277,434 B2
(45) Date of Patent: Apr. 30, 2019

(54) METHOD FOR ENCODING REAL NUMBER M-ARY SIGNAL AND ENCODING APPARATUS USING SAME

(71) Applicant: IDAC Holdings, Inc., Wilmington, DE (US)

(72) Inventors: Hae Chung, Yuseong-gu (KR); Han Chung, Yuseong-gu (KR)

(73) Assignee: IDAC Holdings, Inc., Wilmington, DE (US)

( * ) Notice: Subject to any disclaimer, the term of this patent is extended or adjusted under 35 U.S.C. 154(b) by 0 days.

(21) Appl. No.: 15/561,904

(22) PCT Filed: Apr. 21, 2015

(86) PCT No.: PCT/KR2015/003947
§ 371 (c)(1),
(2) Date: Sep. 26, 2017

(87) PCT Pub. No.: WO2016/159431
PCT Pub. Date: Oct. 6, 2016

(65) Prior Publication Data
US 2018/0123839 A1    May 3, 2018

(30) Foreign Application Priority Data

Mar. 27, 2015    (KR) .................. 10-2015-0043625

(51) Int. Cl.
*H04L 27/04*    (2006.01)
*H04L 25/49*    (2006.01)
(Continued)

(52) U.S. Cl.
CPC .......... *H04L 25/4917* (2013.01); *H03M 5/02* (2013.01); *H03M 5/20* (2013.01); *H03M 7/30* (2013.01);
(Continued)

(58) Field of Classification Search
CPC ............. H04L 25/4906; H04L 25/4917; H04L 25/4927; H04L 27/36; H04L 27/365;
(Continued)

(56) References Cited

U.S. PATENT DOCUMENTS

| | | | |
|---|---|---|---|
| 4,300,229 A | | 11/1981 | Hirosaki |
| 5,852,630 A | * | 12/1998 | Langberg ............ H04L 27/2647 375/219 |

(Continued)

FOREIGN PATENT DOCUMENTS

| | | |
|---|---|---|
| JP | 2007-288670 | 11/2007 |
| JP | 2013-048403 | 3/2013 |

(Continued)

OTHER PUBLICATIONS

"Carrier Sense Multiple Access with Collision Detection (CSMA/CD) Access Method and Physical Layer Specifications", IEEE 802.3, Section 4, 2008, 586 pages.
(Continued)

*Primary Examiner* — Siu M Lee
(74) *Attorney, Agent, or Firm* — Eric Berkowitz

(57) ABSTRACT

Disclosed are a real number M-ary signal encoding method, where M is a real number having N time dimensions and L frequency dimensions, and an encoding apparatus using the encoding method. The real number M-ary encoding apparatus according to the present invention comprises a coding unit which codes every K (K is an integer) binary bit units of binary data DATA to generate a first input code and a second input code, a first signal generator which receives the first input code and generates $N_1$ number of $M_1$-ary signals, a second signal generator which receives the second input code and generates $N_2$ number of $M_2$-ary signals, and a first time division multiplexing module which temporally multiplexes the $N_1$ number of $M_1$-ary signals and the $N_2$ number of $M_2$-ary signals to generate a real number M-ary signal which utilizes a voltage ratio a ($a=A_2/A_1$) used for $M_1$-ary and $M_2$-ary signals to minimize a transmission error rate.

28 Claims, 8 Drawing Sheets

(51) Int. Cl.
  *H03M 5/02* (2006.01)
  *H04L 1/00* (2006.01)
  *H03M 7/30* (2006.01)
  *H04L 27/36* (2006.01)
  *H03M 5/20* (2006.01)

(52) U.S. Cl.
  CPC .............. *H04L 1/00* (2013.01); *H04L 27/04* (2013.01); *H04L 27/365* (2013.01); *H04L 27/366* (2013.01)

(58) Field of Classification Search
  CPC ....... H04L 27/366; H04L 27/04; H04L 27/08; H03M 7/00; H03M 7/30
  See application file for complete search history.

(56) References Cited

U.S. PATENT DOCUMENTS

| | | | |
|---|---|---|---|
| 2008/0273614 | A1 | 11/2008 | Heegard et al. |
| 2010/0146363 | A1* | 6/2010 | Birru ..................... H04L 1/0043 714/752 |
| 2014/0177756 | A1* | 6/2014 | Park .................... H04L 27/3405 375/298 |
| 2014/0205283 | A1 | 7/2014 | Djordjevic et al. |
| 2014/0269992 | A1* | 9/2014 | Hong ................. H04L 27/3405 375/298 |
| 2015/0036759 | A1* | 2/2015 | Piesinger ............ H04L 27/2698 375/261 |
| 2015/0063495 | A1* | 3/2015 | Qu ......................... H04L 27/22 375/330 |
| 2015/0358194 | A1* | 12/2015 | Yu .......................... H04L 27/10 370/329 |

FOREIGN PATENT DOCUMENTS

| | | |
|---|---|---|
| JP | 2013-138323 | 7/2013 |
| KR | 10-2010-0005731 | 1/2010 |
| KR | 2015-0062114 | 6/2015 |

OTHER PUBLICATIONS

"Carrier Sense Multiple Access with Collision Detection (CSMA/CD) Access Method and Physical Layer Specifications", IEEE 802.3, Section 3, 2008, 315 pages.
"Carrier Sense Multiple Access with Collision Detection (CSMA/CD) Access Method and Physical Layer Specifications", IEEE Std. 802.3, Section 2, 2008, 790 pages.
"Korean Office Action", Korean Application No. 10-2015-0043625, dated Jan. 27, 2016, 4 pages.
"Korean Office Action (English Translation)", Korean Application No. 10-2015-0043625, dated Jan. 27, 2016, 4 pages.
"English Language translation of KR 2015-0062114", dated Jun. 6, 2015, 26 pages.
"Physical/Electrical Characteristics of Hierarchical Digital Interfaces", ITU-T Recommendation G.703, Nov. 2001, 62 pages.
Beko, Marko, et al., "Designing Good Multi-Dimensional Constellations", IEEE Wireless Communications Letters, vol. 1, No. 3, Jun. 2012, 4 pages.
Chung, Hae, "A Study on M-ary Signaling Scheme with Arbitrary Integer", 2014 Summer Conference of the Korean Institute of Communications and Information Sciences, Jun. 2014, 11 pages.
Chung, Hae, et al., "Encoding Method and Optimal Performance of the Real Number M-ary Signal", International Information Institute, vol. 18, No. 8, pp. 3547-3560, 2015, 14 pages.
Chung, Hae, et al., "Encoding Method and Optimal Performance of the Real Number M-ary Signal", Journal of Communications and Networks, vol. X, No. X, pp. 1-7, Aug. 2015, 7 pages.
Chung, Hae, et al., "Encoding Method of a Rational Number M-ary Signal", IEEE, ICTC 2014, pp. 663-666, Oct. 2014, 4 pages.
Forney, G. D., et al., "Multidimensional Constellations—Part I: Introduction, Figures of Merit, and Generalized Cross Constellations", IEEE Journal on Selected Areas in Communications, vol. 7, No. 6, Aug. 1989, 16 pages.
Forney, G. D., "Multidimensional Constellations—Part II: Voronoi Constellations", IEEE Journal on Selected Areas in Communications, vol. 7, No. 6, Aug. 1989, 18 pages.
Freeman, Roger L., "Bits, Symbols, Bauds, and Bandwidth", IEEE Communications Magazine, Apr. 1998, 4 pages.
Hong, Sungnam, et al., "FQAM: A Modulation Scheme for Beyond 4G Cellular Wireless Communication Systems", Globecom 2013 Workshop—Emerging Technologies for LTE-Advanced and Beyond-4G, 2013, 6 pages.
Minoli, Daniel, "Enterprise Networking: Fractional T1 to SONET Frame Relay to BISDN", Artech House Inc. Boston London pp. 251-254, 1992, 4 pages.
Proakis, John G., "Digital Communications", 4th Edition, New York, McGraw-Hill, 2000, 937 pages.
Stallings, "Data and Computer Communications", 9th Ed., Pearson Education, Inc., Upper Saddle River, NJ, pp. 138-151, 2011, 14 pages.
Stremler, "Introduction to Communication Systems", 3rd Ed., Pearson, pp. 584-589, 1990, 6 pages.
Zhang, Xiaoxia, et al., "Space-Time Code Design with Continuous Phase Modulation", IEEE Journal on Selected Areas in Communications, vol. 21, No. 5, Jun. 2003, 10 pages.

\* cited by examiner

4 QAM
(a)

8 QAM
(b)

8 QAM
(c)

| N | $k_{(1,N)}$ | $k_{(2,N)}$ | $k_{(3,N)}$ | $k_{(4,N)}$ | $k_{(5,N)}$ | $k_{(6,N)}$ | $k_{(7,N)}$ | $k_{(8,N)}$ |
|---|---|---|---|---|---|---|---|---|
| 1 | 0.000 | 1.000 | 1.000 | 2.000 | 2.000 | 2.000 | 2.000 | 3.000 |
| 2 | 0.000 | 1.000 | 1.500 | 2.000 | 2.000 | 2.500 | 2.500 | 3.000 |
| 3 | 0.000 | 1.000 | 1.333 | 2.000 | 2.000 | 2.333 | 2.667 | 3.000 |
| 4 | 0.000 | 1.000 | 1.500 | 2.000 | 2.250 | 2.500 | 2.750 | 3.000 |
| 5 | 0.000 | 1.000 | 1.400 | 2.000 | 2.200 | 2.400 | 2.800 | 3.000 |
| 6 | 0.000 | 1.000 | 1.500 | 2.000 | 2.167 | 2.500 | 2.667 | 3.000 |
| 7 | 0.000 | 1.000 | 1.571 | 2.000 | 2.286 | 2.571 | 2.714 | 3.000 |
| 8 | 0.000 | 1.000 | 1.500 | 2.000 | 2.250 | 2.500 | 2.750 | 3.000 |
| 9 | 0.000 | 1.000 | 1.556 | 2.000 | 2.222 | 2.556 | 2.778 | 3.000 |
| 10 | 0.000 | 1.000 | 1.500 | 2.000 | 2.300 | 2.500 | 2.800 | 3.000 |
| 11 | 0.000 | 1.000 | 1.545 | 2.000 | 2.273 | 2.545 | 2.727 | 3.000 |
| 12 | 0.000 | 1.000 | 1.583 | 2.000 | 2.250 | 2.583 | 2.750 | 3.000 |
| 13 | 0.000 | 1.000 | 1.538 | 2.000 | 2.308 | 2.538 | 2.769 | 3.000 |
| 14 | 0.000 | 1.000 | 1.571 | 2.000 | 2.286 | 2.571 | 2.786 | 3.000 |
| 15 | 0.000 | 1.000 | 1.533 | 2.000 | 2.267 | 2.533 | 2.800 | 3.000 |
| 16 | 0.000 | 1.000 | 1.563 | 2.000 | 2.313 | 2.563 | 2.750 | 3.000 |
| ∞ | 0.000 | 1.000 | 1.585 | 2.000 | 2.322 | 2.585 | 2.807 | 3.000 |

FIG. 9b

| N | $k_{(9,N)}$ | $k_{(10,N)}$ | $k_{(11,N)}$ | $k_{(12,N)}$ | $k_{(13,N)}$ | $k_{(14,N)}$ | $k_{(15,N)}$ | $k_{(16,N)}$ |
|---|---|---|---|---|---|---|---|---|
| 1 | 3.000 | 3.000 | 3.000 | 3.000 | 3.000 | 3.000 | 3.000 | 4.000 |
| 2 | 3.000 | 3.000 | 3.000 | 3.500 | 3.500 | 3.500 | 3.500 | 4.000 |
| 3 | 3.000 | 3.000 | 3.333 | 3.333 | 3.667 | 3.667 | 3.667 | 4.000 |
| 4 | 3.000 | 3.250 | 3.250 | 3.500 | 3.500 | 3.750 | 3.750 | 4.000 |
| 5 | 3.000 | 3.200 | 3.400 | 3.400 | 3.600 | 3.800 | 3.800 | 4.000 |
| 6 | 3.167 | 3.167 | 3.333 | 3.500 | 3.667 | 3.667 | 3.833 | 4.000 |
| 7 | 3.143 | 3.286 | 3.429 | 3.571 | 3.571 | 3.714 | 3.857 | 4.000 |
| 8 | 3.125 | 3.250 | 3.375 | 3.500 | 3.625 | 3.750 | 3.875 | 4.000 |
| 9 | 3.111 | 3.222 | 3.444 | 3.556 | 3.667 | 3.778 | 3.889 | 4.000 |
| 10 | 3.100 | 3.300 | 3.400 | 3.500 | 3.700 | 3.800 | 3.900 | 4.000 |
| 11 | 3.091 | 3.273 | 3.455 | 3.545 | 3.636 | 3.727 | 3.818 | 4.000 |
| 12 | 3.167 | 3.250 | 3.417 | 3.583 | 3.667 | 3.750 | 3.833 | 4.000 |
| 13 | 3.154 | 3.308 | 3.385 | 3.538 | 3.692 | 3.769 | 3.846 | 4.000 |
| 14 | 3.143 | 3.286 | 3.429 | 3.571 | 3.643 | 3.786 | 3.857 | 4.000 |
| 15 | 3.133 | 3.267 | 3.400 | 3.533 | 3.667 | 3.800 | 3.867 | 4.000 |
| 16 | 3.125 | 3.313 | 3.438 | 3.563 | 3.688 | 3.750 | 3.875 | 4.000 |
| ∞ | 3.170 | 3.322 | 3.459 | 3.585 | 3.700 | 3.807 | 3.907 | 4.000 |

FIG. 9c

| N | $k_{(17,N)}$ | $k_{(18,N)}$ | $k_{(19,N)}$ | $k_{(20,N)}$ | $k_{(21,N)}$ | $k_{(22,N)}$ | $k_{(23,N)}$ | $k_{(24,N)}$ |
|---|---|---|---|---|---|---|---|---|
| 1 | 4.000 | 4.000 | 4.000 | 4.000 | 4.000 | 4.000 | 4.000 | 4.000 |
| 2 | 4.000 | 4.000 | 4.000 | 4.000 | 4.000 | 4.000 | 4.500 | 4.500 |
| 3 | 4.000 | 4.000 | 4.000 | 4.000 | 4.333 | 4.333 | 4.333 | 4.333 |
| 4 | 4.000 | 4.000 | 4.000 | 4.250 | 4.250 | 4.250 | 4.500 | 4.500 |
| 5 | 4.000 | 4.000 | 4.200 | 4.200 | 4.200 | 4.400 | 4.400 | 4.400 |
| 6 | 4.000 | 4.167 | 4.167 | 4.167 | 4.333 | 4.333 | 4.500 | 4.500 |
| 7 | 4.000 | 4.143 | 4.143 | 4.286 | 4.286 | 4.429 | 4.429 | 4.571 |
| 8 | 4.000 | 4.125 | 4.125 | 4.250 | 4.375 | 4.375 | 4.500 | 4.500 |
| 9 | 4.000 | 4.111 | 4.222 | 4.222 | 4.333 | 4.444 | 4.444 | 4.556 |
| 10 | 4.000 | 4.100 | 4.200 | 4.300 | 4.300 | 4.400 | 4.500 | 4.500 |
| 11 | 4.000 | 4.091 | 4.182 | 4.273 | 4.364 | 4.455 | 4.455 | 4.545 |
| 12 | 4.083 | 4.167 | 4.167 | 4.250 | 4.333 | 4.417 | 4.500 | 4.583 |
| 13 | 4.077 | 4.154 | 4.231 | 4.308 | 4.385 | 4.385 | 4.462 | 4.538 |
| 14 | 4.071 | 4.143 | 4.214 | 4.286 | 4.357 | 4.429 | 4.500 | 4.571 |
| 15 | 4.067 | 4.133 | 4.200 | 4.267 | 4.333 | 4.400 | 4.467 | 4.533 |
| 16 | 4.063 | 4.125 | 4.188 | 4.313 | 4.375 | 4.438 | 4.500 | 4.563 |
| ∞ | 4.087 | 4.170 | 4.248 | 4.322 | 4.392 | 4.459 | 4.524 | 4.585 |

| N | k(25,N) | k(26,N) | k(27,N) | k(28,N) | k(29,N) | k(30,N) | k(31,N) | k(32,N) |
|---|---|---|---|---|---|---|---|---|
| 1 | 4.000 | 4.000 | 4.000 | 4.000 | 4.000 | 4.000 | 4.000 | 5.000 |
| 2 | 4.500 | 4.500 | 4.500 | 4.500 | 4.500 | 4.500 | 4.500 | 5.000 |
| 3 | 4.333 | 4.667 | 4.667 | 4.667 | 4.667 | 4.667 | 4.667 | 5.000 |
| 4 | 4.500 | 4.500 | 4.750 | 4.750 | 4.750 | 4.750 | 4.750 | 5.000 |
| 5 | 4.600 | 4.600 | 4.600 | 4.800 | 4.800 | 4.800 | 4.800 | 5.000 |
| 6 | 4.500 | 4.667 | 4.667 | 4.667 | 4.833 | 4.833 | 4.833 | 5.000 |
| 7 | 4.571 | 4.571 | 4.714 | 4.714 | 4.857 | 4.857 | 4.857 | 5.000 |
| 8 | 4.625 | 4.625 | 4.750 | 4.750 | 4.750 | 4.875 | 4.875 | 5.000 |
| 9 | 4.556 | 4.667 | 4.667 | 4.778 | 4.778 | 4.889 | 4.889 | 5.000 |
| 10 | 4.600 | 4.700 | 4.700 | 4.800 | 4.800 | 4.900 | 4.900 | 5.000 |
| 11 | 4.636 | 4.636 | 4.727 | 4.727 | 4.818 | 4.818 | 4.909 | 5.000 |
| 12 | 4.583 | 4.667 | 4.750 | 4.750 | 4.833 | 4.833 | 4.917 | 5.000 |
| 13 | 4.615 | 4.692 | 4.692 | 4.769 | 4.846 | 4.846 | 4.923 | 5.000 |
| 14 | 4.643 | 4.643 | 4.714 | 4.786 | 4.857 | 4.857 | 4.929 | 5.000 |
| 15 | 4.600 | 4.667 | 4.733 | 4.800 | 4.800 | 4.867 | 4.933 | 5.000 |
| 16 | 4.625 | 4.688 | 4.750 | 4.750 | 4.813 | 4.875 | 4.938 | 5.000 |
| ∞ | 4.644 | 4.700 | 4.755 | 4.807 | 4.858 | 4.907 | 4.954 | 5.000 |

METHOD FOR ENCODING REAL NUMBER M-ARY SIGNAL AND ENCODING APPARATUS USING SAME

TECHNICAL FIELD

The embodiments according to a concept of the present invention relate to a signal encoding method and an encoding apparatus using the same and, more specifically, to a real number M-ary signal encoding method which can transmit data at high transmission efficiency and high quality and an encoding apparatus using the encoding method.

BACKGROUND ART

As digital communication techniques advance, various M-ary modulation techniques are developed to be used up to now. In a wired communications field, a baseband type of pulse amplitude modulation (PAM) technique is widely used. PAM-2 can be regarded as a type of a binary code. In addition to PAM-3, PAM-4, and PAM-5, PAM-16 is recently used in that field. Like this, PAM tends to be used for wider applications.

Techniques for generating a modulated carrier wave such as amplitude shift keying (ASK), frequency shift keying (FSK), phase shift keying (PSK), quadrature amplitude modulation (QAM), etc. are used for wired/wireless modems and satellite communications. In particular, the QAM technique is being used for 4G mobile communications, WiFi, and ultra high definition (UHD) TV transmission, and it is projected to be applied to 5G mobile communications.

In principle, an M-ary modulation technique is a technique for mapping k-bit (k is an integer greater than 0) binary data to M signal components to be transmitted, and, here, M, which is the number of the signal components, is required to be an integer exponent, that is $2^k$, which restricts the design freedom.

In other words, although more efficient signal transmission is facilitated when M can be freely determined based on the status of a channel on which signals are transmitted, M needs to be selected to satisfy $M=2^k$ according to the conventional M-ary signal modulation technique. Thus, a novel M-ary signal modulation technique which facilitates more efficient signal transmission is highly required.

DETAILED DESCRIPTION OF THE INVENTION

Technical Problem

A technique objective to be obtained by the present invention is to provide a real number M-ary signal encoding method which can improve transmission efficiency according to the channel status, and an encoding apparatus using the encoding method.

Technical Solution

A real number M-ary encoding apparatus according to an embodiment of the present invention comprises: a coding unit which codes every K (K is an integer) binary bit units of binary data DATA to generate a first input code and a second input code; a first signal generator which receives the first input code and generates $N_1$ $M_1$-ary signals; a second signal generator which receives the second input code and generates $N_2$ $M_2$-ary signals; and a first time division multiplexing module which temporally multiplexes the $N_1$ $M_1$-ary signals and $N_2$ $M_2$-ary signals to generate a real number M-ary signal.

Here, $N_1$, $N_2$, $M_1$, and $M_2$ are integers, respectively, and N is an integer equal to $N_1+N_2$.

According to an embodiment of the present invention, M is a real number which is determined by an error rate of a channel and a mean signal to noise ratio (SNR) per bit, and each of $M_1$ and $M_2$ is determined as $M_1$=[M] and $M_2$=[M]+1, respectively, wherein [M] is a greatest integer which is not greater than M.

According to an embodiment of the present invention, the first signal generator includes a first pulse amplitude modulation (PAM) generator which generates $N_1$ first PAM signals each of which can have $M_1$ voltage levels, and the second signal generator includes a second PAM generator which generates $N_2$ second PAM signals each of which can have $M_2$ voltage levels.

According to an embodiment of the present invention, the real number M-ary encoding apparatus further comprises: a third PAM generator which generates $N_1$ third PAM signals each of which can have $M_1$ voltage levels; a fourth PAM generator which generates $N_2$ fourth PAM signals each of which can have $M_2$ voltage levels; and a second time division multiplexing module which temporally multiplexes the third PAM signals and the fourth PAM signals to generate a second real number M-ary signal.

According to an embodiment of the present invention, a real number M-ary encoding method comprises: coding every K (K is an integer) binary bit units of binary data DATA; mapping the coded binary data DATA to $N_1$ $M_1$-ary signals; mapping the coded binary data DATA to $N_2$ $M_2$-ary signals; and temporally multiplexing the $N_1$ $M_1$-ary signals and $N_2$ $M_2$-ary signals to generate a first real number M-ary signal.

Here, $N_1$, $N_2$, $M_1$, and $M_2$ are integers, respectively, and N is an integer equal to $N_1+N_2$.

Here, M is at least a mean of $M_j$ (j=1, 2), and N is a sum of $N_j$ (j=1, 2).

Advantageous Effects

According to the real number M-ary encoding method and the real number M-ary encoding apparatus according to embodiments of the present invention, high transmission efficiency is guaranteed by performing an encoding process using an M-ary signal in which M can be freely selected according to the channel status and SNR.

DESCRIPTION OF THE DRAWINGS

FIG. 8 is a constellation diagram of a rectangular QAM according to another embodiment of the present invention.

FIGS. 9A-9D are tables showing transmission bit numbers per signal component of an N-dimensional M-ary signal according to an embodiment of the present invention.

FIG. 10 is a graph showing an error rate of an arbitrary integer M-ary PAM signal.

MODE OF THE INVENTION

Figure 1A:
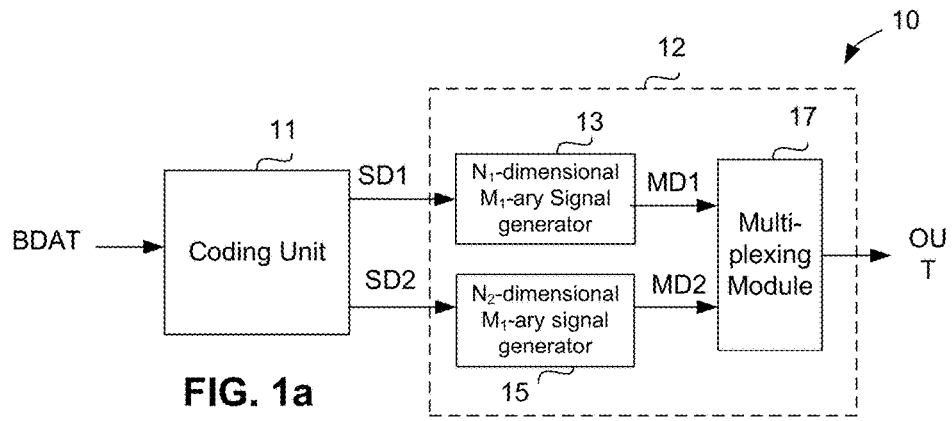
FIG. 1A is a configuration block diagram schematically representing a real number M-ary encoding apparatus according to an embodiment of the present invention.

Specific configurational and functional description on embodiments of the present invention which are disclosed in this specification or in this application is merely provided for the purpose of describing the embodiments of the present invention; however, the embodiments of the present invention can be practiced in various forms and are not to be construed to be limited to those embodiments which are described in this specification or application.

Since the embodiments of the present invention can be varied in various ways and have various shapes, specific embodiments are illustrated in the appended figures and will be explained in more detail in this specification or application. However, the appended figures are not provided to limit the embodiments according to the concept of the present invention to the specific disclosed aspects, and it is rather to be understood that the embodiment of the present invention encompass all variations, equivalents, and replacements which fall in to the technical spirit and are included in the technical scope of the present invention.

Although terms such as "first" and/or "second" can be used for describing various components, the components are not to be limited by these terms. The terms are only used for discriminating one component from other components, that is, a first component can be denoted as a second component, and, in the similar manner, the second component can be denoted as the first component without departing from the scope according to the concept of the present invention.

When it is mentioned that a certain component is "coupled with" or "connected to" a different component, the certain component can be directly coupled with or connected to the different component; however, it is to be understood that other components can exist between these two components. To the contrary, when it is mentioned that a certain component is "directly coupled with" or "directly connected to" a different component, it is to be understood that no other component exists between the two components. The same principle applies when comprehending other expressions for describing relations among components such as "between ~ and ~" and "directly between ~ and ~" as well as "neighboring~" and "directly neighboring~".

The terms used in the specification are provided only for describing specific embodiments, and they are not to be construed to limit the present invention. A singular expression also includes plural expressions unless explicitly stated otherwise according to the context. In this specification, the terms "including" or "having" are only used to specify that there exist described features, numbers, steps, operations, components, parts, or a combination of them, and it is to be understood that they do not preclude the possibility of existence or addition of one or more other features, numbers, steps, operations, components, parts, or a combination of them.

Unless defined otherwise, all terms including technical and scientific terms that are used in the specification have the same meanings as normally understood by a person with an ordinary skill in the art to which the present invention pertains. The terms as defined in the dictionary normally used in the art are to be interpreted to have the meaning coincident with the contextual meaning of the related art, and they are not to be interpreted to be an ideal or too formal meaning unless expressly defined so in this specification.

In the following, the present invention will be explained in detail by describing preferred embodiments of the present invention by referring to the appended figures. The identical reference symbols shown in respective figures represent identical members.

The embodiments of the present invention provide an N-dimensional M-ary signal encoding method which can select an optimal M value according to a channel status by enabling M to be an arbitrary rational number.

The embodiments of the present invention provide an M-ary signal encoding method, where a mean of $M_j$ (j=1, 2) is a rational number by combining $N_1$ successive $M_1$-ary signals with $N_2$ successive $M_2$-ary signals.

FIG. 1A is a configuration block diagram schematically representing a real number M-ary encoding apparatus according to an embodiment of the present invention. When referring to FIG. 1A, the real number M-ary encoding apparatus 10 according to an embodiment of the present invention includes a coding unit 11 and a real number M-ary modulator 12. The real number M-ary modulator 12 includes a first signal generator 13, a second signal generator 15, and a time division multiplexing module 17.

The coding unit 11 receives binary data BDAT, codes every K binary bits of the binary data BDAT, and provides the coded result as input codes SD1, SD2 for the first signal generator 13 and the second signal generator 15. The coding unit 11 can include a serial-parallel converter 110 and a symbol mapper 120 which will be explained by referring to FIG. 2.

The first signal generator 13 modulates the first input code SD1 and outputs a first modulation signal MD1. Specifically, the first signal generator 13 outputs temporally successive $N_1$ $M_1$-ary signals as the first modulation signal MD1. Therefore, the first signal generator 13 can be referred to as an $N_1$ time-dimensional $M_1$-ary signal generator.

The second signal generator 15 modulates the second input code SD2 and outputs a second modulation signal MD2. Specifically, the second signal generator 15 outputs temporally successive $N_2$ $M_2$-ary signals as the second modulation signal MD2. Therefore, the second signal generator 15 can be referred to as an $N_2$ time-dimensional $M_2$-ary signal generator. In the following, the term 'time dimension' can be shortened to 'dimension.'

The time division multiplexing module 17 temporally multiplexes the first modulation signal MD1 and the second modulation signal MD2 and outputs a real number M-ary modulation signal OUT.

The real number M-ary modulation signal OUT is an N-dimensional M-ary signal, where N is $N_1+N_2$ and M is a mean of $M_1$ and $M_2$ defined by mathematical expression (4).

The real number M-ary encoding apparatus 10 according to an embodiment of the present invention can generate the real number M-ary modulation signal OUT by mapping K-bit binary data into N successive M-ary signals. Since one symbol waveform consists of $N_1$ successive $M_1$-ary signals and $N_2$ successive $M_2$-ary signals, the number of symbol waveforms that can be generated will be $M_1^{N_1} \times M_2^{N_2}$. Therefore, a symbol with the number of $K=[N_1 \log_2 M_1 + N_2 \log_2 M_2]$ bit blocks will be mapped to the N-dimensional M-ary signal.

The real number M-ary encoding apparatus 10 according to an embodiment of the present invention combines two or more different modulation signals to generate one symbol waveform. For example, the real number M-ary encoding apparatus 10 combines the two different modulation signals, which are the $M_1$-ary signal MD1 and the $M_2$-ary signal MD2, to generate one symbol waveform.

When combining $N_1$ temporally successive $M_1$-ary signals with $N_2$ temporally successive $M_2$-ary signals, G codes can be generated as in mathematical expression (1), $$G = M_1^{N_1} \times M_2^{N_2} \tag{1}$$

where $M_j$ (j=1, 2) is an integer. And N is a sum of $N_1$ and $N_2$ which corresponds to an overall order (that is, time dimension), where $N \geq 1$. That is to say, one of $N_1$ and $N_2$ is always greater than 0. Therefore, K, which is the number of bits per symbol waveform of the N-dimensional M-ary signal that can be transmitted, is expressed as in mathematical expression (2), $$K = [N_1 \log_2 M_1 + N_2 \log_2 M_2] \tag{2}$$

where, [X] is a greatest integer which is not greater than X.

And, when $k_{(M,N)}$ is defined as a mean transmission bit number per signal component, $k_{(M,N)}$ will be expressed as in mathematical expression (3).

$$k_{(M,N)} = K/N = [N_1 \log_2 M_1 + N_2 \log_2 M_2]/N \tag{3}$$

Where $N(N_1+N_2)$ is the sum of all time dimensions, that is, the order. And, when a mean of $M_j$ is defined as M, M will be expressed as in mathematical expression (4), and it is a rational number.

$$M = E[M_j] = \frac{N_1 M_1 + N_2 M_2}{N} \tag{4}$$

Where $E[M_j]$ represents a mean of $M_j$.

Since the Gaussian function is applied in mathematical expression (2), not all of the symbol waveforms that can be generated is used, and, therefore, the number $M_e$ of effective signal components will be obtained as in mathematical expression (5).

$$M_e = 2^{k(M,N)} \tag{5}$$

Since the number $M_e$ of effective signal components is 2 to the power of a rational number, it is a real number.

Therefore, the real number M-ary encoding apparatus 10 according to an embodiment of the present invention generates the M-ary signal OUT having an arbitrary real number.

Since $M_e \leq M$, mathematical expression (6) can be obtained from mathematical expression (4) and mathematical expression (5).

$$[\log_2 M_1^{N_1} M_2^{N_2}] \leq \log_2 \left[ \frac{N_1 M_1 + N_2 M_2}{N_1 + N_2} \right]^{N_1+N_2} \tag{6}$$

The real number M-ary encoding method according to an embodiment of the present invention will be described as follows. The 'encoding' process herein represents a correspondence as shown in mathematical expression (7), when x is a binary data vector consisting of K elements and y is an M-ary signal vector consisting of N elements, $$y = f(x) \tag{7}$$

where, $x=[x_0, \ldots, x_{K-1}]$ and $y=[y_0, \ldots, y_{N-1}]$. Although a conventional M-ary signal represents a vector to scalar correspondence, the encoding apparatus according to an embodiment of the present invention represents a vector to vector correspondence, and it generates a real number M-ary signal.

The real number M-ary encoding apparatus 10 according to an embodiment of the present invention can be applied to all signal encoding schemes including ASK, FSK, PSK, QAM, amplitude and phase shift keying (APSK), and amplitude, phase, and frequency shift keying (APFSK).

When one of the first signal generator 13 and the second signal generator 15 is removed and, then, the time division multiplexing module 17 is removed from the embodiment shown in FIG. 1A, that is, when one of $N_1$ and $N_2$ is 0, the encoding apparatus 10 can be an arbitrary integer M-ary encoding apparatus.

Figure 1B:
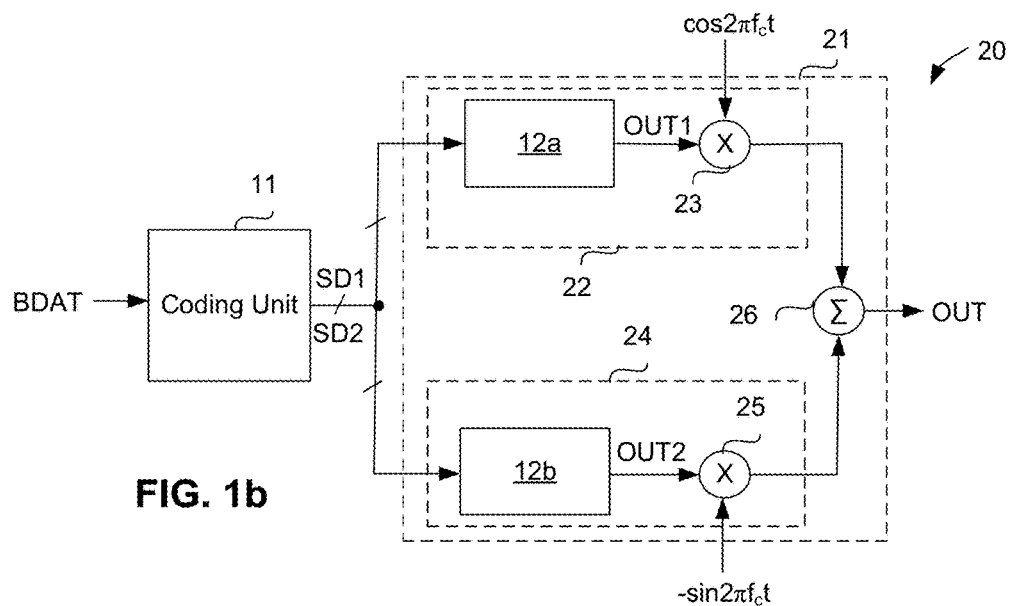
FIG. 1B is a configuration block diagram schematically representing a real number M-ary encoding apparatus according to another embodiment of the present invention.

FIG. 1B is a configuration block diagram schematically representing a real number M-ary encoding apparatus according to another embodiment of the present invention. When referring to FIG. 1B, the real number M-ary encoding apparatus 20 according to another embodiment of the present invention includes a coding unit 11 and a modulating block 21. The modulating block 21 includes an I channel signal generator 22, a Q channel signal generator 24, and an adder 26.

The I channel signal generator 22 includes an I channel M-ary modulator 12a and a first multiplier 23, while the Q channel signal generator 24 includes a Q channel M-ary modulator 12b and a second multiplier 25.

The configuration of each of the I channel M-ary modulator 12a and the Q channel M-ary modulator 12b is the same as that of the real number M-ary modulator 12 shown in FIG. 1A.

The first multiplier 23 multiplies an output OUT1 of the I channel M-ary modulator 12a by a first cosine signal cos $2\pi f_c t$ to generate an I channel modulation signal, while the second multiplier 25 multiplies an output OUT2 of the Q channel M-ary modulator 12b by a first sine signal $-\sin 2\pi f_c t$, which is orthogonal to the first cosine signal cos $2\pi f_c t$, to generate a Q channel modulation signal.

The adder 26 calculates a sum of the I channel modulation signal and the Q channel modulation signal and transmits the calculated sum.

Therefore, according to an embodiment of the present invention, an N-dimensional M-ary amplitude and phase shift keying (APSK) signal can be generated.

Figure 1C:
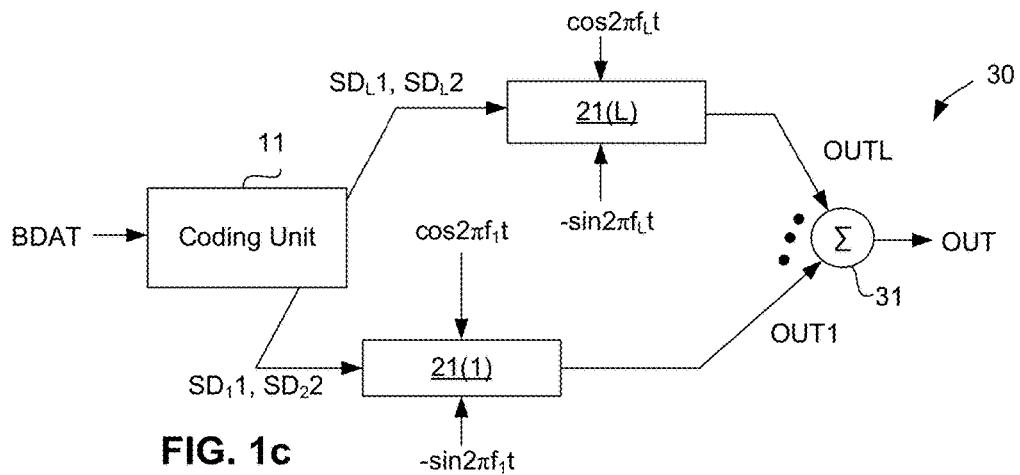
FIG. 1C is a configuration block diagram schematically representing a real number M-ary encoding apparatus according to still another embodiment of the present invention.

FIG. 1C is a configuration block diagram schematically representing a real number M-ary encoding apparatus according to still another embodiment of the present invention. When referring to FIG. 1C, the real number M-ary encoding apparatus 30 according to still another embodiment of the present invention includes a coding unit 11, a plurality of (L) modulation blocks 21(1), . . . , 21(L) which are connected in parallel, and an adder 31.

Each of the modulation blocks 21(1), . . . , 21(L) has the same configuration as that of the modulating block 21 which is shown in FIG. 1B. However, a frequency of the sine (or cosine) signal, which is inputted to each of the modulation blocks, varies.

For example, the first modulation block 21(1) uses the first cosine signal $\cos 2\pi f_1 t$ and the first sine signal $-\sin 2\pi f_1 t$ which have a first frequency f1, while the $L^{th}$ modulation block 21(L) uses the $L^{th}$ cosine signal $\cos 2\pi f_L t$ and the $L^{th}$ sine signal $-\sin 2\pi f_L t$ which have the $L^{th}$ frequency $f_L$.

In this regard, when L modulation blocks are connected in parallel according to the frequency, a real number M-ary signal having N time dimensions and L frequency dimensions can be generated. In this case, the number of codes that can be generated is enlarged from G as in mathematical expression (1) or mathematical expression (9) to $G^L$.

In a region where inter carrier interference (ICI) is severe, the codes can be allocated to skip the frequencies one by one. And, when the ICI gets more severe, it is possible to skip two or more frequencies to reduce the number of usable codes. It is performed to improve performance with respect to an error rate by sacrificing the transmission rate.

The adder 31 sums up the signal OUT1, which is modulated by the first frequency ($f_1$), through the signal OUTL, which is modulated by the $L^{th}$ frequency, and transmits the sum.

Therefore, according to an embodiment of the present invention, it is possible to generate a real number M-ary signal having N time dimensions combined with L frequency dimensions by using multiple modulation blocks which are connected in parallel by frequency.

Figure 2:
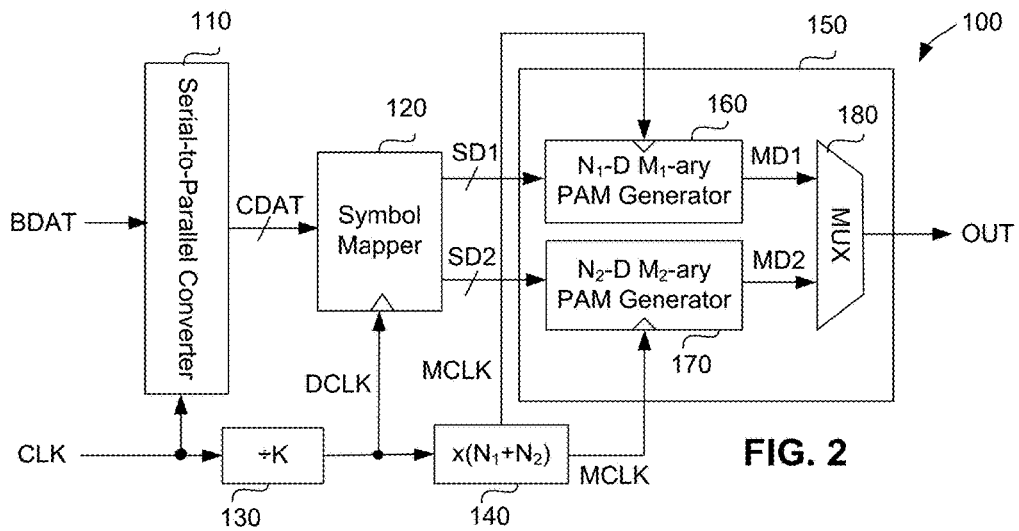
FIG. 2 is a configuration block diagram representing an N-dimensional M-ary pulse amplitude modulation (PAM) modulator according to an embodiment of the present invention.
Figure 3:
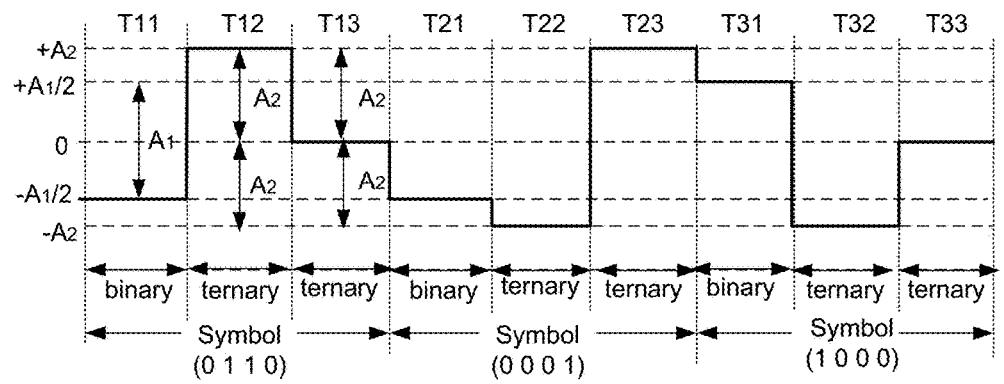
FIG. 3 is a diagram showing a waveform of a 3-dimensional $2^{4/3}$-ary PAM signal according to an embodiment of the present invention.
Figure 4:
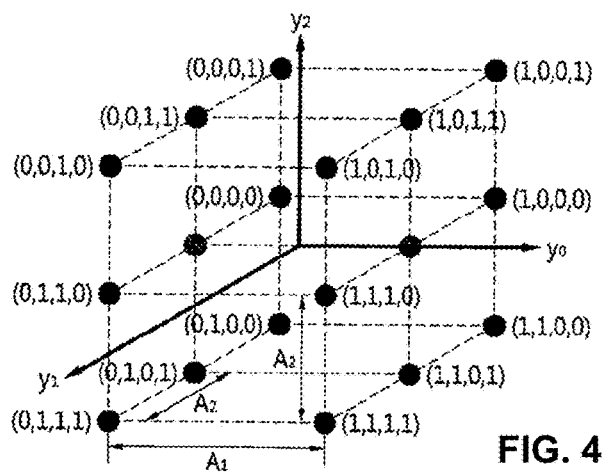
FIG. 4 is a constellation diagram of the 3-dimensional $2^{4/3}$-ary PAM signal according to an embodiment of the present invention.

FIG. 2 is a configuration block diagram schematically representing an N-dimensional M-ary pulse amplitude modulation (PAM) modulator according to an embodiment of the present invention. FIG. 3 is a diagram showing a waveform of a 3-dimensional $2^{4/3}$-ary PAM signal according to an embodiment of the present invention, and FIG. 4 is a constellation diagram of the 3-dimensional $2^{4/3}$-ary PAM signal according to an embodiment of the present invention.

When referring to FIG. 2, the N-dimensional M-ary encoding apparatus 100 according to an embodiment of the present invention includes a serial-parallel converter 110, a symbol mapper 120, a K-frequency divider 130, an N-frequency multiplier 140, and a real number M-ary PAM signal generator 150.

The serial-parallel converter 110 converts series of binary data BDAT into K-bit parallel data CDAT in response to an input clock signal CLK.

The symbol mapper 120 maps the K-bit binary data CDAT to a symbol waveform which is to be transmitted in response to a divided clock signal DCLK.

The K-frequency divider 130 divides the input clock signal CLK by K to generate the divided clock signal DCLK.

The N-frequency multiplier 140 frequency multiplies the divided clock signal DCLK by N to generate a multiplied clock signal MCLK.

The real number M-ary PAM signal generator 150 can include a first PAM generator 160, a second PAM generator 170, and a time division multiplexing module 180.

The first PAM generator 160 generates an $N_1$-dimensional $M_1$-ary PAM signal MD1. The second PAM generator 170 generates an $N_2$-dimensional $M_2$-ary PAM signal MD2.

When the real number M is determined, $M_1$ and $M_2$ can be determined as in mathematical expression (8), $$M_1=[M], M_2=[M]+1 \quad (8)$$

where, M is a maximum integer which is not greater than M. Therefore, when the real number M is determined, $M_1$ is determined as a maximum integer that does not exceed M, and $M_2$ is determined to be an integer which is $M_1+$'1'.

For example, when it is assumed that the real number M is 3.5, $M_1$ is determined to be 3 while $M_2$ can be determined to be 4.

Next, the value of $N_j$ can be determined by considering both complexity and efficiency. There can be a trade-off between complexity and efficiency, and $N_j$ can be determined by such trade-off between complexity and efficiency. It will be explained in the following.

When $M_j$ and $N_j$ are determined, K is determined by mathematical expression (2). Therefore, the serial-parallel converter 110 converts the binary data BDAT, which is inputted in series, to K-bit parallel data CDAT. The K-bit parallel data CDAT constitutes a symbol. Therefore, when the binary data BDAT having a speed of R [bits/s] is inputted to be converted to parallel data by the serial-parallel converter 110, the speed of symbols will be R/K.

The symbol mapper 120 can generate a gray code which maintains only one bit interval between adjacent symbol waveforms in order to minimize the error rate of the symbols.

According to an embodiment of the present invention, the symbol mapper 120 can include a mapping table which maps an input x to an output y when k-bit binary data CDAT is input x, according to mathematical expression (7).

When $M \neq 2^k$ for the real number M-ary signal according to an embodiment of the present invention, there exist codes to which no binary data is allocated as indicated as gray dots in FIG. 4. Additionally, the symbol mapper 120 can discriminate the waveforms to be used from those not to be used according to strategies considering parameters such as power consumption and robustness against errors.

As explained above, the real number M-ary signal is generated as a combination of two arbitrary integer $M_j$-ary signals.

The first PAM generator 160 generates $N_1$ PAM signals MD1, each of which can have $M_1$ voltage levels, while the second PAM generator 170 generates $N_2$ PAM signals MD2, each of which can have $M_2$ voltage levels. Here, $M_j$ is an arbitrary integer and not necessarily $2^k$.

The time division multiplexing module 180 serves to alternately transmit $N_1$ $M_1$-ary signal waveforms and $N_2$ $M_2$-ary signal waveforms.

Let us assume that $(M_1, N_1)=(2, 1)$ and $(M_2, N_2)=(3, 2)$ in the embodiment of FIG. 2. Then, as shown in FIG. 3, the encoding apparatus 100 of FIG. 2 can generate a 3-dimensional M-ary PAM signal which consists of one binary signal and two ternary signals.

When referring to FIGS. 2 and 3, the 3-dimensional M-ary PAM signal OUT according to an embodiment of the present invention can consist of a combination of two ternary PAM signals and one binary PAM, which are of baseband type.

The first PAM generator 160 generates one binary PAM signal MD1, while the second PAM generator 170 generates two ternary PAM signals MD2.

The time division multiplexing module 180 repeatedly performs an operation of transmitting one binary PAM signal MD1, which are of baseband type, and, then, transmitting two ternary PAM signals MD2 in a seamless manner.

As shown in FIG. 3, the time division multiplexing module 180 transmits the binary PAM signal MD1, which is outputted from the first PAM generator 160, during a T11 period, transmits two ternary PAM signals MD2, which are outputted from the second PAM generator 170, during T12 and T13 periods, transmits again the binary PAM signal MD1, which is outputted from the first PAM generator 160, during a T21 period, and transmits two ternary PAM signals MD2, which are outputted from the second PAM generator 170, during T22 and T23 periods.

The number of codes which can be generated by using one binary PAM signal MD1 and two ternary PAM signals MD2 is 18 ($G=2^1 \times 3^2$). Therefore, since the bit number that can be transmitted by one symbol waveform is K=4 and the overall dimension is N=3, $x=[x_0, x_1, x_2, x_3]$ is to be mapped to $y=[y_0, y_1, y_2]$. Here, since $M_1=2$, $y_0$ has two voltage levels, and ($y_1$, $y_2$) has three voltage levels, since $M_2=3$. Since M=8/3 from mathematical expression (4), it is a rational number.

When a voltage level difference between adjacent $M_1$-ary and $M_2$-ary signals are defined to $A_1$ and $A_2$, respectively, $y_0$ has a value of $\pm A_1/2$ while $y_1$ and $y_2$ has a value of 0 or $\pm A_2$.

Therefore, the binary PAM signal MD1 can have a voltage level of $+A_1/2$ or $-A_1/2$ while the ternary PAM signal MD2 can have a voltage level of $+A_2$, 0, or $-A_2$.

FIGS. 3 and 4 illustrate waveforms and constellation diagrams of a signal obtained by mapping a symbol of a 4-bit block to a gray code based on the above description. In FIGS. 3 and 4, symbols (0, 1, 1, 0), (0, 0, 0, 1), and (1, 0, 0, 0) are mapped to ($-A_1/2$, $+A_2$, 0), ($-A_1/2$, $-A_2$, $+A_2$), and ($+A_1/2$, $-A_2$, 0). Since 16 symbols are required to allocate a 4-bit binary number, two gray points ($+A_1/2$, 0, 0) and ($-A_1/2$, 0, 0), which are positioned on the $y_0$-axis in FIG. 4, can be used for other uses (such as for synchronization), and are not used for allocating symbols. Therefore, the number of effective signal components, which is calculated only by using actually used codes, can be obtained as $M_e=2^{3/4}$ from mathematical expression (3) and mathematical expression (5), and it is a real number. When the overall order exceeds 3 in the real number M-ary PAM modulation, the constellation map cannot be represented in a 2-dimensional plane.

In the embodiments as above, a ratio of $A_1$ with respect to $A_2$ plays an important role on the performance, and, therefore, a method of obtaining an optimal ratio will be described later.

When referring to FIG. 2 again, an M-ary modulation signal OUT having an arbitrary integer can be obtained by removing one of the first PAM generator 160 and second PAM generator 170 as well as the time division multiplexing module 180 from the embodiment shown in FIG. 2. That is to say, when $N_1$ or $N_2$ is '0' in the embodiment of FIG. 2, the M-ary modulation signal OUT comes to be an M-ary modulation signal having an arbitrary integer.

Signal processing speeds for respective process steps will be as follows. When an input speed of the binary data is R [bits/s], the speed of the output of the serial-parallel converter 110 is R/K, and, therefore, the symbol mapper 120 has to process the symbols at a speed of R/K. And, since the processing speed of one signal component is to be faster than the processing speed of the symbols by N ($=N_1+N_2$) times, the speed of the clock signal which is required for the M-ary PAM signal generator 150 needs to be the clock of the symbol mapper 120 multiplied by N. Finally, the modulation rate, that is, the speed at which the signal component is converted comes to be $(N_1+N_2)R/K$ [baud].

Figure 5:
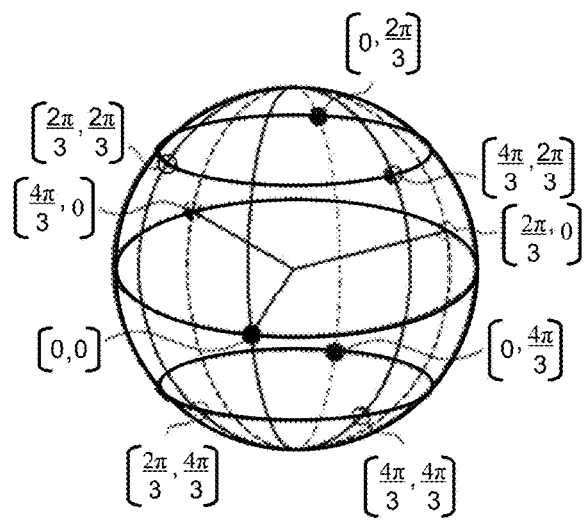
FIG. 5 is a constellation diagram of a 2-dimensional 3-PSK according to an embodiment of the present invention, wherein $(M_1, N_1)=(3, 2)$ and $N_2=0$.

FIG. 5 is a constellation diagram of a 2-dimensional 3-PSK according to an embodiment of the present invention, wherein ($M_1$, $N_1$)=(3, 2) and $N_2$=0. The 2-dimensional 3-PSK signal in FIG. 5 can be generated by an encoding apparatus 200 in FIG. 6 which will be described in the following. Specifically, the embodiment of FIG. 5 corresponds to one of the case when ($M_1$, $N_1$)=(3, 2) and $N_2$=0 is met in the embodiment in FIG. 6.

When referring to FIG. 5, one symbol will be mapped to two ternary PSK signals in case of ($M_1$, $N_1$)=(3, 2) and $N_2$=0. Since the number G of codes that can be generated is 9 ($M_1^{N_1} \times M_2^{N_2}=3^2 \times 1$), the bit number that can be transmitted by one symbol waveform is K=3, and since N=$N_1$=2 from mathematical expression (2), and $x=[x_0, x_1, x_2]$ is to be mapped to $y=[y_0, y_1]$.

And, since M=3 in mathematical expression (4), there will be three phases, and when $y_0$ and $y_1$ have phases of 0 or $\pm \pi/3$, respectively, the constellation diagram can be obtained as in FIG. 5. That is, some points are displaced at a spacing of $\pm \pi/3$ on an equator plane of a sphere, and additional points are also displaced at a spacing of $\pm \pi/3$ on longitude lines crossing respective point positions on the equator plane.

And, the bit number that can be transmitted by one signal component will be $k_{(3,2)}=3/2$ bits from mathematical expression (3). As for a real number M-ary PSK scheme, when the overall order exceeds 2, the constellation diagram cannot be shown in a 2-dimensional plane.

Figure 6:
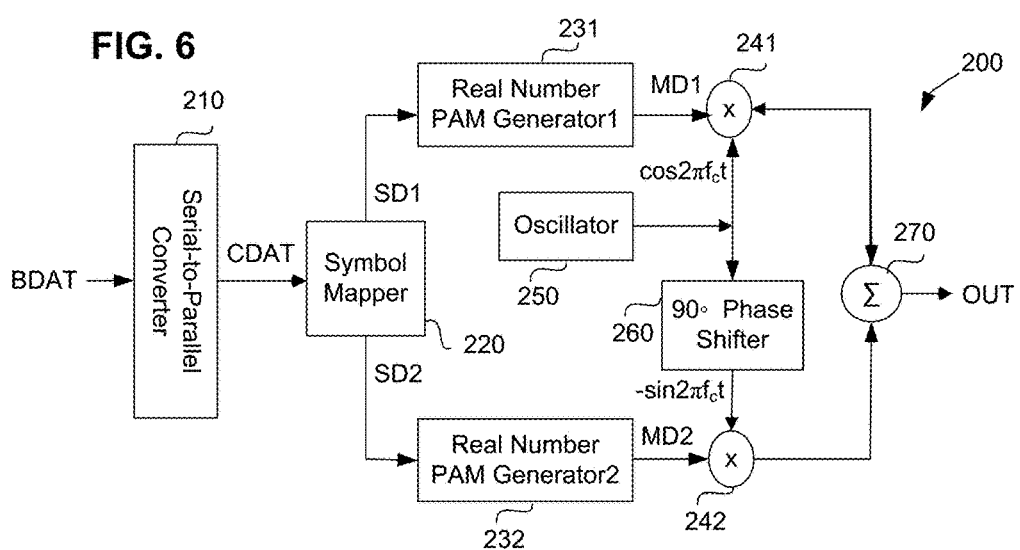
FIG. 6 is a configuration block diagram representing a real number M-ary encoding apparatus according to another embodiment of the present invention.

FIG. 6 is a configuration block diagram representing a real number M-ary encoding apparatus according to another embodiment of the present invention. The real number M-ary encoding apparatus of FIG. 6 can be a real number M-ary PSK modulator, a real number M-ary QAM modulator, or a real number M-ary APSK modulator.

When referring to FIG. 6, the real number M-ary modulation signal OUT includes an in-phase I channel signal and a quadrature Q channel signal. As a matter of fact, the M-ary PSK modulator and the M-ary QAM modulator can be a subset of the M-ary APSK modulator.

Specifically, the real number M-ary encoding apparatus 200 according to an embodiment of the present invention can include real number PAM generators 231, 232 on the I and Q channels, respectively. The real number PAM generator can have the same configuration as that of the real number PAM generator 150 as shown in FIG. 2. Let us denote the real number PAM generator 231 for I channel as a first real number PAM generator 231 and the real number PAM generator 232 for Q channel as a second real number PAM generator 232 for the convenience of description.

The real number M-ary encoding apparatus 200 also includes a serial-parallel converter 210, a symbol mapper 220, a first multiplier 241, a second multiplier 242, an oscillator 250, a phase shifter 260, and an adder 270.

Also, the real number M-ary encoding apparatus 200 can further include a K-frequency divider (130 in FIG. 2) for generating a clock signal to be inputted to the symbol mapper 220, and an N-frequency multiplier (140 in FIG. 2) for generating the clocks signals to be inputted to the first and second PAM generators (231, 232).

The serial-parallel converter 210 converts series of binary data BDAT to K-bit parallel data CDAT.

The symbol mapper 220 serves to map the k-bit binary data CDAT to the symbol waveform to be transmitted. For example, the symbol mapper 220 codes every K binary bits of the binary data CDAT and provides the coded result as input codes SD1, SD2 for the real number PAM generators 231, 232.

Each of the first and second real number PAM signal generators 231, 232 can include the first PAM generator 160, the second PAM generator 170, and the time division multiplexing module 180 which are illustrated in FIG. 2. Each of the first and second real number PAM signal generators 231, 232 can output the first real number M-ary signal MD1 and the second real number M-ary signal MD2.

The first multiplier 241 multiples the first real number M-ary signal MD1 by the first cosine signal cos $2\pi f_c t$ to generate the I channel modulation signal.

The second multiplier 242 multiplies the second real number M-ary signal MD2 12b by a first sine signal $-\sin 2\pi f_c t$, which is orthogonal to the first cosine signal cos $2\pi f_c t$, to generate the Q channel modulation signal.

The oscillator 250 generates the first cosine signal cos $2\pi f_c t$ and the phase shifter 260 shifts the phase of the first cosine signal cos $2\pi f_c t$ by 90 degrees to generate the first sine signal $-\sin 2\pi f_c t$.

The adder 270 obtains a sum of the I channel modulation signal and the Q channel modulation signal and transmits the sum.

In the following, an embodiment in which the real number M-ary encoding apparatus 200 is realized as a QAM modulator will be explained.

When the real number M-ary QAM modulator is to be obtained, two N $(=N_1+N_2)$ dimensional real number M-ary PAM signal generators are required.

Thus, the number G of codes that can be generated is expressed as in mathematical expression (9).

$$G=(M_1^{N_1}M_2^{N_2})^2 \quad (9)$$

The number K of bits that can be transmitted per code is expressed as in mathematical expression (10).

$$K=[2(N_1 \log_2 M_1 + N_2 \log_2 M_2)] \quad (10)$$

And, the number of bits to be transmitted per signal component is $k_{(M,N)}=K/N$.

Here, two embodiments for arranging M-ary QAM signals will be proposed in the following.

According to a first embodiment, each of the first real number PAM signal generator 231 and the second real number PAM signal generator 232 in the embodiment of FIG. 6 is realized as $M_1^{N_1} \times M_2^{N_2}$ PAM generators. In this manner, when both the I channel and Q channel use $M_1^{N_1} \times M_2^{N_2}$ PAM generators, a square QAM is obtained, and the mean number M of signal components will be expressed as in mathematical expression (11).

$$M = E[M_j] = \frac{N_1 M_1^2 + N_2 M_2^2}{N} \quad (11)$$

According to a second embodiment, $M_1^{N_1} \times M_2^{N_2}$ PAM generators are used for the I channel and $M_2^{N_2} \times M_1^{N_1}$ PAM generators are used for the Q channel in the embodiment of FIG. 6. That is, the first real number PAM generator 231 is $M_1^{N_1} \times M_2^{N_2}$ PAM generators while the second real number PAM generator 232 is $M_2^{N_2} \times M_1^{N_1}$ PAM generators. In this case, a rectangular QAM is obtained, and the mean number M of signal components will be expressed as in mathematical expression (12).

$$M = E[M_j] = \begin{cases} \dfrac{(N_1-N_2)M_1^2 + 2N_2 M_1 M_2}{N}, & N_1 \geq N_2 \\ \dfrac{2N_1 M_1 M_2 + (N_2-N_1)M_2^2}{N}, & N_1 < N_2 \end{cases} \quad (12)$$

Therefore, the mean number of the signal components assume different values according to the method of arranging points in the constellation diagram. However, since two embodiments have the same bit number, $k_{(M,N)}$, that can be transmitted per signal component, the number $M_e$ of the effective signal components remains the same.

Then, let us take an example using a real number M-ary QAM signal.

As for the conventional QAM, when N=1, the conventional QAM has two dimensions using both the amplitude and the phase at the same time; however, as for real M-ary QAM when N is two or more, since the real M-ary QAM has multiple amplitudes and phases, it has $2^N$ dimensions. Therefore, when N>1, it is not possible to represent the constellation diagram. So, it will be reasonable to represent the constellation diagram for respective time dimensions.

Figure 7:
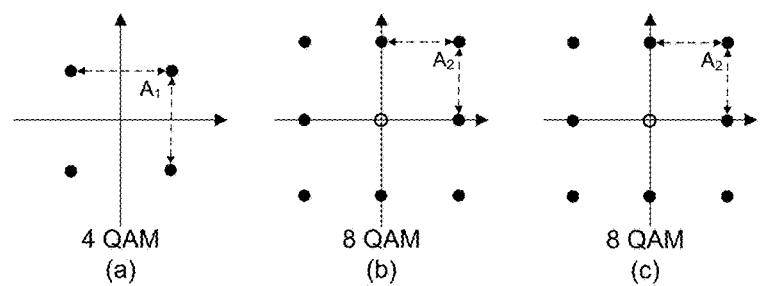
FIG. 7 is a constellation diagram of a square quadrature amplitude modulation (QAM) according to an embodiment of the present invention.
Figures 8, 9A:
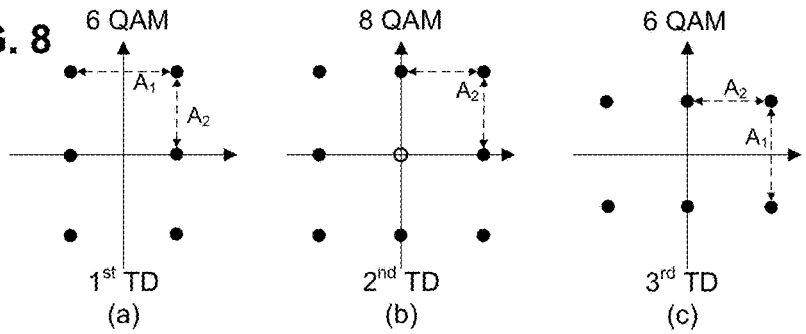

FIG. 7 is related to an embodiment of the present invention and represents a constellation diagram of a square quadrature amplitude modulation (QAM) when both the first and second real number PAM generators in FIG. 6 sequentially generate binary-ternary-ternary waveforms as shown in FIG. 2; and FIG. 8 is related to another embodiment of the present invention and represents a constellation diagram of a rectangular QAM when the first real number PAM generator in FIG. 6 generates binary-ternary-ternary waveforms as shown in FIG. 2 and the second real number PAM generator in FIG. 6 generates ternary-ternary-binary waveforms as shown in FIG. 2 in a sequential manner.

In FIGS. 7 and 8, (a) represents a first time-dimensional constellation diagram, (b) represents a second time-dimensional constellation diagram, and (c) represents a third time-dimensional constellation diagram.

The square QAM in FIG. 7 can be obtained by applying binary-ternary-ternary PAM to both I and Q channels as shown in FIG. 6. The rectangular QAM in FIG. 8 can be obtained by applying the binary-ternary-ternary PAM and the ternary-ternary-binary PAM to the I channel and the Q channel as shown in FIG. 6, respectively.

Both the embodiments related to FIGS. 7 and 8 can generate 324 (G=4×9×9 or G=6×9×6) codes in total, they can transmit 8 bits per symbol waveform, and they can transmit 8/3 bits per signal component since they have three dimensions. And, M=22/3 holds for the square QAM and M=7 holds for the rectangular QAM according to mathematical expression (11) and mathematical expression (12). However, they both have the same effective signal component number $M_e=2^{8/3}$.

Since the number of codes that are actually used in the embodiments related to FIGS. 7 and 8 is 256, a point, which is positioned at a center of the second and third time dimension constellation diagrams for the square QAM of FIG. 7, cannot be used. As for the rectangular QAM of FIG. 8, it is possible that a point, which is positioned at a center of the second time dimensional constellation diagram, is not used, and, furthermore, 32 additional codes can be excluded from a symbol mapping.

In the following, the error rate of the conventional PAM is compared and analyzed with respect to the performance of a real number M-ary PAM signal according to an embodiment of the present invention.

The conventional M-ary signal, that is the M-ary signal where M satisfies $2^k$, can be regarded as a specific case of the N-dimensional M-ary signal according to an embodiment of the present invention (when $M_1=2^k$, $N=N_1=1$, and $N_2=0$).

Let us consider a case where an additive white Gaussian noise (AWGN) with a variance $\sigma^2=N_0/2$ is applied to an M-ary PAM signal with a voltage level interval A between adjacent signals. Here, No is a power spectrum density of the white noise. The error rate $P_M$ of the signal is known as in mathematical expression (13).

$$P_M = \frac{2(M-1)}{M} Q\left(\frac{A}{2\sigma}\right) \quad (13)$$

Here, A/2 can be defined as a noise margin. And average power S per signal component is expressed as in mathematical expression (14), $$S = \frac{M^2-1}{3}\left(\frac{A}{2}\right)^2 = s\left(\frac{A}{2}\right)^2 \quad (14)$$

were, s is the average power when the noise margin is 1 (that is, A/2=1). Although mathematical expression (14) was derived for the case when M is an even number, it also holds for odd numbers.

By applying $$A = 2\sqrt{\frac{S}{s}} \text{ and } \sigma = \sqrt{\frac{N_0}{2}},$$

which were obtained from mathematical expression (14), to mathematical expression (13), the error rate $P_M$ is expressed as in mathematical expression (15).

$$P_M = \frac{2(M-1)}{M} Q\left(\sqrt{\frac{2\left(\frac{S}{N_0}\right)}{s}}\right) \quad (15)$$

The error rate ($P_M$) can be expressed as in mathematical expression (16) by representing mathematical expression (15) using an error function, $$P_M = \frac{(M-1)}{M}\text{erfc}\left(\frac{\sqrt{\gamma_{av}}}{s}\right) = \frac{(M-1)}{M}\text{erfc}\left(\sqrt{\frac{\gamma_b}{\delta}}\right) \quad (16)$$

where, $$\text{erfc}(x) = \frac{2}{\sqrt{x}}\int_x^\infty e^{-t^2} dt,$$

and $\gamma_{av}$, $\gamma_b$, and $\delta$ (=s/k) represent a signal to noise ratio (SNR) per signal component, an SNR per bit, and a mean SNR per bit for a unit noise margin case, respectively.

When M assumes an arbitrary integer, it is also a specific case for the real number M-ary signal, and it corresponds to the case where N (=$N_1 \geq 1$), $N_2=0$, and M(=$M_1$) is an arbitrary integer. In this case, the SNR per signal, $\gamma_{av}$, will be expressed as in mathematical expression (17).

$$\gamma_{ab} = \gamma_b[k_{(M,N)}]_{N_2=0} = \frac{[N\log_2 M]}{N}\gamma_b \quad (17)$$

Since mathematical expression (14) holds for M having an odd value, when the probability that an error occurs in one signal component of the N-dimensional arbitrary integer M-ary PAM is expressed as $P_{(M,N)}$, the error rate $P_{(M,N)}$ will be expressed as in mathematical expression (18).

$$P_{(M,N)} = \frac{(M-1)}{M}\text{erfc}\left(\sqrt{\frac{\gamma_b}{\delta_{(M,N)}}}\right) \quad (18)$$

Here, $\delta_{(M,N)}$ represents the average power of the signal per unit bit in a unit noise margin case according to the N-dimensional M-ary PAM and is expressed as in mathematical expression (19).

$$\delta_{(M,N)} = \frac{s}{k_{(M,N)}} = \frac{s}{[N\log_2 M]/N} \quad (19)$$

Therefore, the error rate $P_M$ of the convention M-ary signal corresponds to a specific case of the N-dimensional M-ary PAM, that is, when $M=2^k$ and $N=1$ are applied to $P_{(M,N)}$.

When calculating the error rate of symbols, it is possible to obtain the error rate of symbols by using the error rates of respective signal components, when white noise probability density functions among N successive signals in one symbol are independent of one another. That is, when the possibility of an error in one symbol is defined as $P^S_{(M,N)}$, it can be obtained as in mathematical expression (20).

$$P^S_{(M,N)} = 1-(1-P_{(M,N)})^N \quad (20)$$

The N-dimensional M-ary signal according to an embodiment of the present invention consists of $N_1$ successive $M_1$-ary signals and $N_1$ successive $M_2$-ary signals. When voltage differences between adjacent voltage levels used in the $M_1$-ary and $M_2$-ary cases are expressed as $A_1$ and $A_2$, respectively, since $M_1$-ary signals occur $N_1$ times and $M_2$-ary signals occur $N_2$ times in one symbol waveform of the real number M-ary PAM, the average power of the signal can be expressed as in mathematical expression (21).

$$S = \frac{N_1}{N}s_1\left(\frac{A_1}{2}\right)^2 + \frac{N_2}{N}s_2\left(\frac{A_2}{2}\right)^2 = \beta_1\left(\frac{A_1}{2}\right)^2 = \beta_2\left(\frac{A_2}{2}\right)^2 \quad (21)$$

Here, $s_j=(M_j^2-1)/3$, and $\beta_j$ is expressed as in mathematical expression (22).

$$\beta_1 = \frac{N_1}{N}s_1 + \frac{N_2}{N}s_2 a^2, \beta_2 = \frac{N_1}{N}\frac{s_1}{a^2} + \frac{N_2}{N}s_2 \quad (22)$$

Here, a (=$A_2/A_1$) represents a ratio between adjacent voltage levels used in the $M_1$-ary signals and the $M_2$-ary signals.

Since the error rate of the real number PAM is calculated by obtaining a mean of the arbitrary integer $M_1$-ary and arbitrary integer $M_2$-ary PAM error rates, the error rate of the real number PAM is expressed as in mathematical expression (23).

$$\overline{P_{(M,N)}} = \sum_{j=1}^{2} \frac{N_j}{N} \frac{2(M_j-1)}{M_j} Q\left(\frac{A_j}{2\sigma}\right) \tag{23}$$

Since $A_j = 2\sqrt{S/\beta_j}$ is obtained from mathematical expression (21), mathematical expression (23) can be expressed as in mathematical expression (24).

$$\overline{P_{(M,N)}} = \sum_{j=1}^{2} \frac{N_j}{N} \frac{(M_j-1)}{M_j} \text{erfc}\left(\frac{\sqrt{\gamma_{av}}}{\beta_j}\right) = \tag{24}$$

$$\sum_{j=1}^{2} \frac{N_j}{N} \frac{(M_j-1)}{M_j} \text{erfc}\left(\frac{\sqrt{\gamma_b k_{(M_j,N_j)}}}{\beta_j}\right)$$

Here, since $\beta_j$ includes both $s_1$ and $s_2$, mathematical expression (24) is not the mean of an error rate of respective $M_j$-ary signals. The ratio between voltage intervals, a, is defined as in mathematical expression (25).

$$a = \sqrt{\frac{s_1}{s_2}} = \sqrt{\frac{M_1^2 - 1}{M_2^2 - 1}} \tag{25}$$

Since $\beta_j$ comes to be $s_j$, mathematical expression (24) is expressed as a mean of respective $M_j$-ary signal error rates as in mathematical expression (26).

$$\overline{P_{(M,N)}} = \sum_{j=1}^{2} \frac{N_j}{N} \frac{(M_j-1)}{M_j} \text{erfc}\left(\frac{\sqrt{\gamma_b}}{\delta_j}\right) = \frac{N_1}{N} P_{(M_1,N_1)} + \frac{N_2}{N} P_{(M_2,N_2)} \tag{26}$$

Here, $\delta_j = s_j/k_{(M_j,N_j)}$, and represents the SNR per unit bit for unit noise margin according to the $N_j$-time dimensional $M_j$-ary PAM.

As will be described in detail in the following, the result does not have the minimum error rate for SNR. The optimal performance in principle is accomplished when a real number M is applied to $k=\log_2 M$ of $\delta$ in mathematical expression (16). In order to be close to this optimal performance, two terms in mathematical expression (24) need to be represented as one term as in mathematical expression (16). That is, the next relation is to be satisfied.

$$\frac{k_{(M_1,N_1)}}{\beta_1} = \frac{k_{(M_2,N_2)}}{\beta_2} \tag{27}$$

Finally, the optimal ratio can be obtained as in mathematical expression (28).

$$a = \sqrt{\frac{k_{(M_1,N_1)}}{k_{(M_2,N_2)}}} = \sqrt{\frac{[N_1 \log_2 M_1]/N_1}{[N_2 \log_2 M_2]/N_2}} \tag{28}$$

When mathematical expression (28) is put into mathematical expression (24), a minimum error rate can be obtained as in mathematical expression (29).

$$\overline{P}_{(M,N)}^{min} = \left(\frac{N_1}{N} \frac{(M_1-1)}{M_1} + \frac{N_2}{N} \frac{(M_2-1)}{M_2}\right) \text{erfc}\left(\sqrt{\frac{\gamma_b}{\overline{\delta}}}\right) \tag{29}$$

Here, $\overline{\delta}$ is a mean of $\delta_j$, and expressed as in mathematical expression (30).

$$\overline{\delta} = \frac{N_1}{N} \frac{s_1}{k_{(M_1,N_1)}} + \frac{N_2}{N} \frac{s_2}{k_{(M_2,N_2)}} \tag{30}$$

Finally, the symbol error rate is obtained as in mathematical expression 31 in the similar manner as for mathematical expression (20).

$$P_{(M,N)}^S = 1 - \Pi_{j=1}^{2}(1 - \overline{P}_{(M_j,N_j)}^{min})^{N_j} \tag{31}$$

In the following, there is proposed a method of determining a proper value of N by trade-off between the implementation simplicity (or calculation complexity) and the transmission efficiency, when determining the bit number that can be transmitted by one signal component. Also, there is proposed a method of determining an optimal M by using a graph depicting the mean SNR versus bits and the signal error rate.

At first, a case for an arbitrary integer M-ary signal (that is, $N=N_1$ and $N_2=0$) is described. In this case, the bit number that can be transmitted by one signal component is $k_{(M,N)} = [N\log_2 M]/N$.

FIGS. 9A-9D are tables showing transmission bit numbers $k_{(M,N)}$ per signal component of an N-dimensional M-ary signal. Specifically, FIGS. 9A-9D are tables showing $k_{(M,N)}$ which is calculated for $2 \le M \le 32$ and $1 \le N \le 16$.

When referring to FIGS. 9A-9D, although the bit number $k_{(M,N)}$ which can be transmitted by one signal component is not a monotone increasing function, $k_{(M,N)}$ approaches $\log_2 M$ when N approaches infinity. That is mathematical expression (32) holds.

$$\lim_{N \to \infty} k_{(M,N)} = \lim_{N \to \infty} \frac{[N\log_2 M]}{N} = \log_2 M \tag{32}$$

Also, when $M=2^k$, that is $M=2, 4, 8$, it has a constant value irrespective of the value of N. Therefore, it is preferable to select $N=1$ when $M=2^k$ is satisfied as in the conventional cases. However, when $M \ne 2^k$, N, which is determined by the trade-off, is to be selected when $k_{(M,N)}$ is not a constant.

Red-colored numbers in FIGS. 9A-9D represent values which provide a maximum transmission bit number $k_{(M,N)}$ per signal component when $1 \le N \le 16$. Nevertheless, in some cases, it is not necessary to select some values, which provide the maximum transmission bit number, since implementation gets too complex as N increases. For example, a maximum value $k_{(3,12)}=1.583$ within the range does not have to be selected since it is bigger than $k_{(3,2)}$ by only about 5.5%. In particular, when $k_{(7,5)}$ is compared with $k_{(7,\infty)}$, the difference in the transmission efficiency is only 0.25%. Therefore, it is be preferable to use the values in the gray boxes in FIGS. 9A-9D.

Thus, N can be determined by using the transmission bit number $k_{(M,N)}$ per signal component of the N-dimensional M-ary signal as shown in FIGS. 9A-9D.

For example, when $M_1$ and $M_2$ are determined, $N_1$, which corresponds to the determined $M_1$, and $N_2$, which corresponds to the determined $M_2$, can be determined by using FIGS. 9A-9D. At first, when $N_1$, which corresponds to the determined $M_1$, is to be determined, $M_2$ and $N_2$ are assumed to be 0 in FIGS. 9A-9D and a relatively small value (that is, a value incurring low complexity) among values for N causing a big (or biggest) transmission bit number $k_{(M,N)}$ per signal component can be selected as $N_1$ by considering the transmission bit number $k_{(M,N)}$ per signal component as well as the complexity. Next, when $N_2$, which corresponds to the determined $M_2$, is to be determined, $M_1$ and $N_1$ are assumed to be 0 in FIGS. 9A-9D and a relatively small value (that is, a value incurring low complexity) among values for N causing a big (or biggest) transmission bit number $k_{(M,N)}$ per signal component can be selected as $N_2$. In this manner, when $M_1$ is 5 and $M_2$ is 6, $N_1$ and $N_2$ can be determined as '4' and '2', respectively, by referring to FIG. 9A. The optimal $N_j$ (j=1, 2) which is obtained by referring to FIGS. 9A-9D when $M_j$ (j=1, 2) lies in 2≤M≤16, can be summarized as in Table 1.

TABLE 1

| $M_j$ | | | | | | | | | | | | | | |
|---|---|---|---|---|---|---|---|---|---|---|---|---|---|---|
| 2 | 3 | 4 | 5 | 6 | 7 | 8 | 9 | 10 | 11 | 12 | 13 | 14 | 15 | 16 |
| $N_j$ 1 | 2 | 1 | 4 | 2 | 5 | 1 | 6 | 4 | 5 | 2 | 5 | 5 | 6 | 1 |

In the similar manner, the optimal $N_j$ (j=1, 2) which is obtained by referring to FIGS. 9A-9D when $M_j$ (j=1, 2) lies in 17≤M≤32, can also be summarized as in Table 2.

TABLE 2

| $M_j$ | | | | | | | | | | | | | | | |
|---|---|---|---|---|---|---|---|---|---|---|---|---|---|---|---|
| 17 | 18 | 19 | 20 | 21 | 22 | 23 | 24 | 25 | 26 | 27 | 28 | 29 | 30 | 31 | 32 |
| $N_j$ 12 | 6 | 5 | 4 | 3 | 5 | 2 | 7 | 5 | 3 | 4 | 5 | 6 | 8 | 10 | 1 |

Figures 9D, 10:
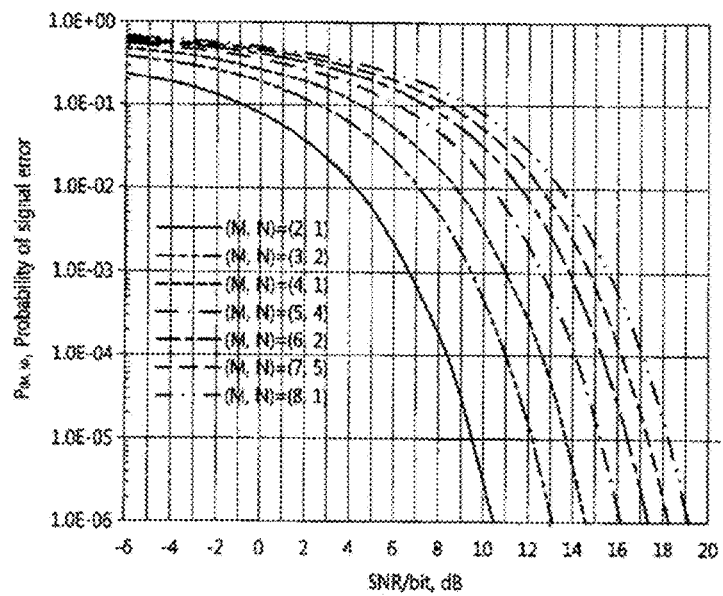

FIG. 10 is a graph showing an error rate of an arbitrary integer M-ary PAM signal.

The signal error rate shown in FIG. 10 is calculated for mean SNR per bit based on the (M, N) values in the gray boxes in FIG. 9 and mathematical expression (18). As can be seen in FIG. 10, the error rate for M=3 lies between M=2 and M=4, while the error rates for M=5, 6, 7 lie between M=4 and M=8.

In the following, a method of determining M, when an SNR for a given channel and an error rate to be satisfied are fixed, will be described by referring to FIGS. 9 and 10.

Let us assume that a mean SNR per bit is 13 dB for a certain channel and the error rate should be equal to or lower than $10^{-5}$.

When referring to FIG. 10, M=4 cannot be selected in this case. It is because an SNR greater than 13 dB should be provided in order to satisfy the criterion, $10^{-5}$ or lower, for M=4. Therefore, M=2 should be selected according to the conventional method. Thus, the bit number that can be transmitted per signal is $k_{(2,1)}=1$. However, when the 2-dimensional ternary PAM signal method is adopted as shown in FIG. 9, it is possible to meet the criterion, $10^{-5}$ or lower, even at 13 dB when M=3. Since $k_{(3,2)}=1.5$ in this case, the transmission efficiency is increased by 50% compared to the case when M=2.

Figure 11:
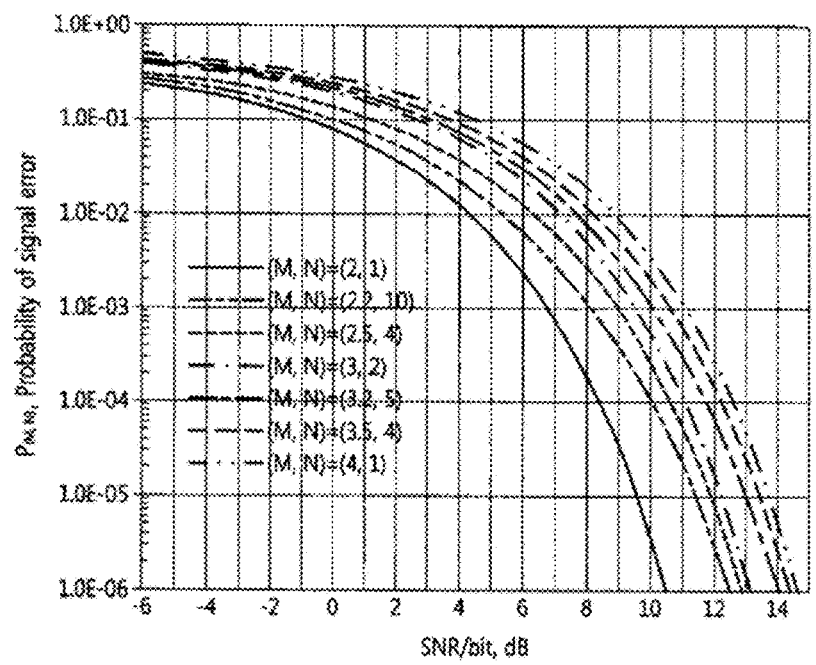
FIG. 11 is a graph showing an error rate of an arbitrary real number M-ary PAM signal.

FIG. 11 is a graph showing an error rate of an real number M-ary PAM signal.

Specifically, FIG. 11 shows a mean error rate for SNR based on mathematical expression (26), when $M_e$ is a real number. When referring to FIG. 11, an error rates for M=2.2 and M=2.5 are shown in the range of 2<M<3, while error rates for M=3.2 and M=3.5 are shown in the range of 3<M<4.

A case for M=3.5 and N=4 will be specifically described. Since N=4 for a 4-time dimensional 3.5-ary PAM signal, one symbol waveform consists of four signal components, and particularly, it consists of 2-dimensional ternary PAM signals and 2-dimensional 4-ary PAM signals. Thus, an overall number G of codes is 144 ($3^2 \times 4^2$), and, when 128 codes are mapped to binary data, one symbol can transmit 7 bits. That is, one signal component transmits 1.75 ($=k_{(3.5, 4)}$) bits as in mathematical expression (3).

When referring to FIG. 11, it can be seen that the error rate approaches $P_{(M_2,N_2)}$ as the SNR increases. This means that the second term in mathematical expression (26) dominates for a high SNR. It also means that, mathematical expression (26) is not an optimal solution.

Figure 12:
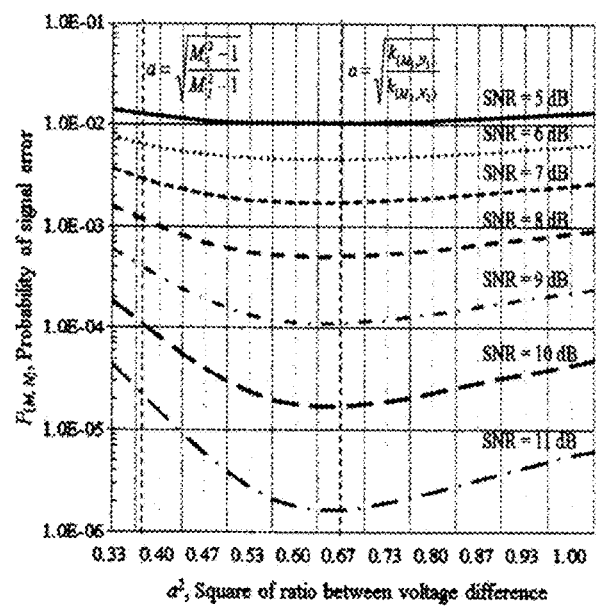
FIG. 12 is a graph showing a signal error rate $P_{(2.2, 10)}$ with respect to a ratio of $a^2$.

FIG. 12 is a graph showing a signal error rate $P_{(2.2, 10)}$ with respect to a ratio of $a^2$. FIG. 12 shows that the error rate $P_{(2.2, 10)}$ takes various values in various SNRs according to a. As mentioned in the above, it has the optimal value when $$a = \frac{A_2}{A_1} = \sqrt{\frac{k_{(M_1,N_1)}}{k_{(M_2,N_2)}}}$$

for a high SNR. The optimal value exists since the second term dominates for a low a while the first term dominates for a high a in mathematical expression (24).

Figure 13:
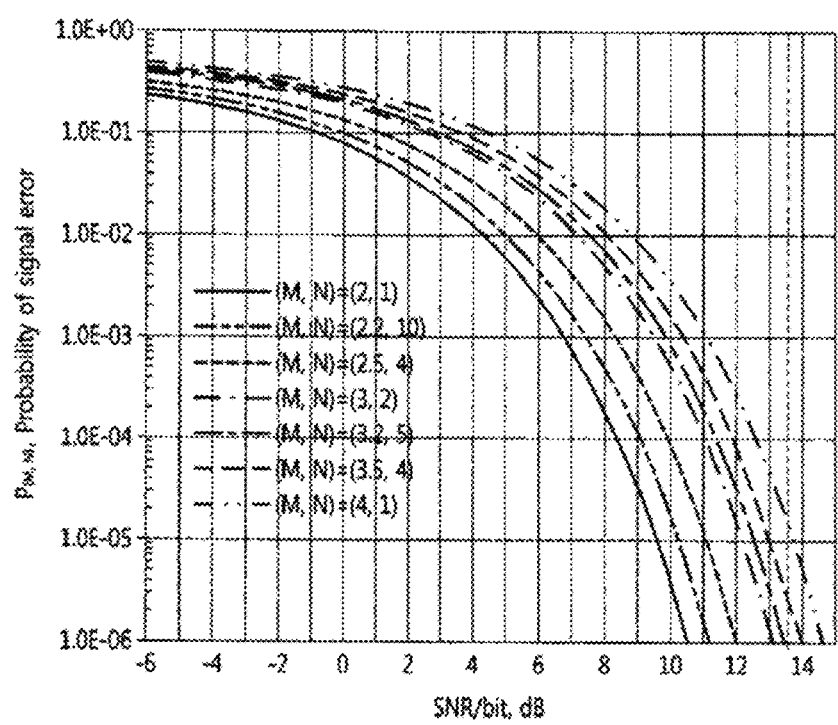
FIG. 13 is a graph showing an optimized signal error rate of the real number M-ary signal.

FIG. 13 is a graph showing an optimized signal error rate of the real number M-ary signal.

FIG. 13 is drawn by plotting the error rates for an optimal ratio a based on mathematical expression (29) and mathematical expression (30) by using the same parameters as used in FIG. 11. When compared to FIG. 11, it can be seen that the performance has been improved even for M having a real number without approaching $P_{(M_2, N_2)}$. For example, by comparing FIGS. 11 and 13, it can be seen that the performance of latter has been improved by 1 dB or more while satisfying the error rate criterion $10^{-5}$ for M=2.2. This means that the optimization for the ratio a between differences of adjacent voltages plays a key role on the performance.

Then, let us consider again the upper limit of the error rate, $10^{-5}$, when the SNR of a receiver is assumed to be 13.5 dB. The conventional M=4-ary signal cannot be selected because the error rate will exceed $10^{-5}$ for the corresponding SNR. Therefore, M=2, which provides the transmission bit number of 1 per signal component, has to be is selected. To the contrary, a 4-dimensional 3.5-ary PAM signal satisfies the corresponding error rate. Therefore, the proposed method provides an increase of 75% in the channel efficiency when compared with the conventional binary signal. Even when the system complexity increases, the channel efficiency will approach 100% when $N_2$ can be increased infinitely. Also, the efficiency has been improved by about 17% when compared with the 2-dimensional ternary PAM.

As described in the above, according to the M-ary encoding apparatus 10, 20, 30 100, or 200 according to an embodiment of the present invention, high transmission efficiency can be guaranteed for a given SNR by using an M-ary signal where M could be freely selected according to a channel status.

Also, according to the embodiments of the present invention, the transmission rate can be finely tuned.

Each of the components of the present invention can be implemented as hardware, software, or a combination of hardware and software.

The present invention can also be implemented as computer readable codes (that is, computer programs) that are recorded on a computer readable recording medium. The computer readable recording medium includes all kinds of recording devices on which data, which can be read by a computer system, can be stored.

Some examples of the computer readable recording medium includes a read only memory (ROM), a random access memory (RAM), a compact disc read only memory (CD-ROM), a magnetic tape, a floppy disk, an optical data storage device, and the program code for performing a method of estimating an object information according to the present invention can be transmitted as a carrier wave (for example, transmission over the Internet).

The computer readable recording medium can be distributed over a computer system where computers are connected to each other in a network, and the computer readable codes can be stored or executed in a distributive manner. And, functional programs, codes, and code segments for implementing the present invention can be easily construed by normal programmers in the technical field to which the present invention pertains.

Although the present invention has been described by referring to an embodiment of the present invention shown in the figures, it is a mere example of the present invention, and the person with an ordinary skill in the art to which the present invention pertains will readily understand that various variations and other equivalent embodiments can be embodied from this description. Therefore, the sincere technical scope of the present invention is to be defined by the technical spirit represented by appended claims.

INDUSTRIAL APPLICABILITY

The present invention can be applied to data processing fields as well as signal communication fields.

The invention claimed is:

1. An M-ary encoding apparatus, comprising:
a coding unit configured to code, from binary data, to generate a first coded sequence and a second coded sequence, the coding unit including a serial-parallel converter configured to convert serial binary data to K-bit parallel data and a symbol mapper configured to map the K-bit parallel data to the first coded sequence and the second coded sequence;
a signal generator configured to generate: (1) from the first coded sequence, a first number of $M_1$-ary signals; and (2) from the second coded sequence, a second number of $M_2$-ary signals; and
a multiplexer configured to multiplex the first number of $M_1$-ary signals and the second number of $M_2$-ary signals to generate a multiplexed M-ary signal, where $M_1$ and $M_2$ are integers.

2. The M-ary encoding apparatus of claim 1, wherein the coding unit is configured to code: (1) a first set of K binary data bits to generate a first portion of the first coded sequence and the second coded sequence; and (2) one or more further sets of K binary data bits to generate one or more further portions of the first coded sequence and the second coded sequence.

3. The M-ary encoding apparatus of claim 1, wherein the multiplexer is configured to time and/or frequency multiplex the first number of $M_1$-ary signals and the second number of $M_2$-ary signals.

4. The M-ary encoding apparatus of claim 1, wherein the first number of $M_1$-ary signals are $N_1$ number of $M_1$-ary signals and the second number of $M_2$-ary signals are $N_2$ number of $M_2$-ary signals, where $N_1$ and $N_2$ are integers.

5. The M-ary encoding apparatus of claim 1, further comprising:
a processor configured to:
determine, as a determined result, any of: (1) an error rate of a channel; (2) a noise level associated with the channel; or (3) a signal to noise ratio (SNR) per bit;
establish a real number M based on the determined result; and
determine $M_1$, as $M_1 = [M]$, and $M_2$, as $M_2 = [M]+1$, where [M] is a greatest integer which is not greater than the real number M.

6. The M-ary encoding apparatus of claim 2, wherein:
the first number of $M_1$-ary signals are $N_1$ number of $M_1$-ary signals and the second number of $M_2$-ary signals are $N_2$ number of $M_2$-ary signals, where $N_1$ and $N_2$ are integers; and
K is determined using an equation $K = [N_1 \log 2 M_1 + N_2 \log 2 M_2]$.

7. The M-ary encoding apparatus of claim 4, wherein:
$N = N_1 + N_2$;
$N_j$ (j=1 or 2) is determined based on a transmission efficiency level and a calculation complexity level;
the transmission efficiency level includes a mean transmission bit number per signal component of the multiplexed M-ary signal; and
the mean transmission bit number per signal component is calculated as $[N_1 \log 2 M_1 + N_2 \log 2 M_2]/N$.

8. The M-ary encoding apparatus of claim 7, wherein
$N_j$ (j=1 or 2) is 1 on a condition that $M_j$ (j=1 or 2) is 2, 4, 8, 16, or 32,
$N_j$ (j=1 or 2) is 2 on a condition that $M_j$ (j=1 or 2) is 3, 6, 12, or 23,
$N_j$ (j=1 or 2) is 3 on a condition that $M_j$ (j=1 or 2) is 21 or 26, $N_j$ (j=1 or 2) is 4 on a condition that $M_j$ (j=1 or 2) is 5, 10, 20, or 27, $N_j$ (j=1 or 2) is 5 on a condition that $M_j$ (j=1 or 2) is 7, 11, 13, 14, 19, 22, 25, or 28, $N_j$ (j=1 or 2) is 6 on a condition that $M_j$ (j=1 or 2) is 9, 15, 18, or 29, $N_j$ (j=1 or 2) is 7 on a condition that $M_j$ (j=1 or 2) is 24, $N_j$ (j=1 or 2) is 8 on a condition that $M_j$ (j=1 or 2) is 30, $N_j$ (j=1 or 2) is 10 on a condition that $M_j$ (j=1 or 2) is 31, and $N_j$ (j=1 or 2) is 12 on a condition that $M_j$ (j=1 or 2) is 17.

9. The M-ary encoding apparatus of claim 1, wherein:
the signal generator includes:
  a first pulse amplitude modulation (PAM) generator configured to generate the first number of first PAM signals, the first PAM signals having $M_1$ number of voltage levels, and
  a second PAM generator configured to generate the second number of second PAM signals, the second PAM signals having $M_2$ number of voltage levels; and
the multiplexer includes a first multiplexing device configured to temporally multiplex the first PAM signals and the second PAM signals.

10. The M-ary encoding apparatus of claim 9, wherein:
the signal generator further includes:
  a third PAM generator configured to generate the first number of third PAM signals, the third PAM signals having $M_1$ number of voltage levels, and
  a fourth PAM generator configured to generate the second number of fourth PAM signals, the fourth PAM signals having $M_2$ number of voltage levels; and
the multiplexer further includes a second multiplexing device configured to temporally multiplex the third PAM signals and the fourth PAM signals.

11. The M-ary encoding apparatus of claim 10, wherein:
the first multiplexing device is configured to temporally multiplex the first PAM signals and the second PAM signals such that the first PAM signals are first in time and the second PAM signals are second in time, as a first PAM multiplexed signal; and
the second multiplexing device is configured to multiplex the third PAM signals and the fourth PAM signals such that the third PAM signals are first in time and the fourth PAM signals are second in time, as a second PAM multiplexed signal.

12. The M-ary encoding apparatus of claim 11, further comprising:
a first multiplier configured to multiply the first PAM multiplexed signal by a cosine signal to generate an I channel modulation signal;
a second multiplier configured to multiply the second PAM multiplexed signal by a sine signal, which is orthogonal to the cosine signal, to generate a Q channel modulation signal; and
an adder configured to sum the I channel modulation signal and the Q channel modulation signal.

13. The M-ary encoding apparatus of claim 1, further comprising:
a K-frequency divider configured to divide an input clock signal by K to generate a divided clock signal; and
an N-frequency multiplier configured to multiply a frequency of the divided clock signal by N to generate a multiplied clock signal, wherein:
the symbol mapper is configured to operate in response to the divided clock signal, and
the signal generator is configured to operate in response to the multiplied clock signal.

14. The M-ary encoding apparatus of claim 1, wherein the multiplexed M-ary signal is one of: (1) a N time-dimensional M-ary PAM signal; (2) a N time-dimensional M-ary amplitude shift keying (ASK) signal; (3) a N time-dimensional M-ary frequency shift keying (FSK) signal; (4) a N time-dimensional Mary phase shift keying (PSK) signal; (5) a N time-dimensional M-ary quadrature amplitude modulation (QAM) signal; or (6) a N time-dimensional and L frequency dimensional M-ary amplitude, phase, and frequency modulation (APFSK) signal.

15. The M-ary encoding apparatus of claim 14, further comprising a processor configured to allocate one or more codes for a channel environment having inter-channel interference (ICI) above a threshold such that frequencies are skipped when generating the N time-dimensional and L frequency-dimensional M-ary APFSK signal.

16. An M-ary encoding method, the method comprising:
coding, from binary data, to generate a first coded sequence and a second coded sequence by converting serial binary data to K-bit parallel data and mapping, by a symbol mapper, the K-bit parallel data to the first coded sequence and the second coded sequence;
generating: (1) from the first coded sequence, a first number of $M_1$-ary signals; and (2) from the second coded sequence, a second number of $M_2$-ary signals; and
multiplexing the first number of $M_1$-ary signals and the second number of $M_2$-ary signals to generate a multiplexed M-ary signal, where $M_1$ and $M_2$ are integers.

17. The M-ary encoding method of claim 16, wherein the coding of the first coded sequence and the second coded sequence includes coding (1) a first set of K binary data bits to generate a first portion of the first coded sequence and the second coded sequence; and (2) one or more further sets of K binary data bits to generate one or more further portions of the first coded sequence and the second coded sequence.

18. The M-ary encoding method of claim 16, wherein the multiplexing of the first number of $M_1$-ary signals and the second number of $M_2$-ary signals includes time and/or frequency multiplexing the first number of $M_1$-ary signals and the second number of $M_2$-ary signals.

19. The M-ary encoding method of claim 16, wherein the first number of $M_1$-ary signals are $N_1$ number of $M_1$-ary signals and the second number of $M_2$-ary signals are $N_2$ number of $M_2$-ary signals, where $N_1$ and $N_2$ are integers.

20. The M-ary encoding method of claim 16, further comprising:
determining, as a determined result, any of: (1) an error rate of a channel; (2) a noise level associated with the channel; or (3) a signal to noise ratio (SNR) per bit;
establishing a real number M based on the determined result; and
determining $M_1$, as $M_1$=[M], and $M_2$, as $M_2$=[M]+1, where [M] is a greatest integer which is not greater than the real number M.

21. The M-ary encoding method of claim 17, wherein the first number of $M_1$-ary signals are $N_1$ number of $M_1$-ary signals and the second number of $M_2$-ary signals are $N_2$ number of $M_2$-ary signals, where $N_1$ and $N_2$ are integers, the method further comprising
determining K using an equation K=[$N_1$ log 2 $M_1$+$N_2$ log 2 $M_2$].

22. The M-ary encoding method of claim 19, further comprising selecting $N_1$ and $N_2$ based on $M_1$ and $M_2$.

23. The M-ary encoding method of claim 18, wherein:
the generating of the first number of $M_1$-ary signals includes generating $N_1$ number of first PAM signals, the first PAM signals having $M_1$ number of voltage levels;
the generating of the second number of $M_2$-ary signals includes generating $N_2$ number of second PAM signals, the second PAM signals having $M_2$ number of voltage levels;
the generating of the first number of $M_1$-ary signals further includes generating $N_1$ number of third PAM signals, the third PAM signals having $M_1$ number of voltage levels;
the generating of the second number of $M_2$-ary signals further includes generating $N_2$ number of fourth PAM signals, the fourth PAM signals having $M_2$ number of voltage levels; and
the multiplexing of the first number of $M_1$-ary signals and the second number of $M_2$-ary signals includes temporally multiplexing (1) the first PAM signals and the second PAM signals, and (2) the third PAM signals and the fourth PAM signals.

24. The M-ary encoding method of claim 23, wherein the temporally multiplexing of the first PAM signals and the second PAM signals includes: (1) temporally multiplexing the first PAM signals and the second PAM signals such that the first PAM signals are first in time and the second PAM signals are second in time, as a first PAM multiplexed signal; and (2) temporally multiplexing the third PAM signals and the fourth PAM signals such that the third PAM signals are first in time and the fourth PAM signals are second in time, as a second PAM multiplexed signal.

25. The M-ary encoding method of claim 24, further comprising:
multiplying the first PAM multiplexed signal by a cosine signal to generate an I channel modulation signal;
multiplying the second PAM multiplexed signal by a sine signal, which is orthogonal to the cosine signal, to generate a Q channel modulation signal; and
summing the I channel modulation signal and the Q channel modulation signal.

26. The M-ary encoding method of claim 18, wherein the multiplexed M-ary signal is one of: (1) a N time-dimensional M-ary PAM signal; (2) a N time-dimensional M-ary amplitude shift keying (ASK) signal; (3) a N time-dimensional M-ary frequency shift keying (FSK) signal; (4) a N time-dimensional Mary phase shift keying (PSK) signal; (5) a N time-dimensional M-ary quadrature amplitude modulation (QAM) signal; or (6) a N time-dimensional and L frequency dimensional M-ary amplitude, phase, and frequency modulation (APFSK) signal.

27. A real number M-ary encoding apparatus comprising:
a coding unit for coding binary bit units of K bit length binary data to generate a first input code and a second input code, wherein K is an integer, the coding unit comprising a serial-parallel converter configured to convert serial binary data to parallel binary bit units of the K bit length binary data and a symbol mapper configured to map the parallel binary bit units to the first input code and the second input code;
a first signal generator for receiving the first input code and generating $N_1$ number of $M_1$-ary signals;
a second signal generator for receiving the second input code and generating $N_2$ number of $M_2$-ary signals; and
a time division multiplexer for temporally multiplexing the $N_1$ number of $M_1$-ary signals and the $N_2$ number of $M_2$-ary signals to generate a real number M-ary signal, wherein $N_1$, $N_2$, $M_1$, and $M_2$ are integers, respectively.

28. A real number M-ary encoding method comprising:
coding binary bit units of K bit length binary data, wherein K is an integer by converting serial binary data to parallel binary bit units of the K length binary data;
mapping, by a symbol mapper, the parallel binary bit units to $N_1$ number of $M_1$-ary signals and $N_2$ number of $M_2$-ary signals; and
temporally multiplexing the $N_1$ number of $M_1$-ary signals and $N_2$ number of $M_2$-ary signals to generate a first real number M-ary signal, wherein $N_1$, $N_2$, $M_1$, and $M_2$ are integers, respectively.

* * * * *